US010685688B2

(12) United States Patent
Kulkarni et al.

(10) Patent No.: US 10,685,688 B2
(45) Date of Patent: *Jun. 16, 2020

(54) LOW SWING BITLINE FOR SENSING ARRAYS

(71) Applicant: Intel Corporation, Santa Clara, CA (US)

(72) Inventors: Jaydeep P. Kulkarni, Portland, OR (US); Muhammad M. Khellah, Tigard, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/234,065

(22) Filed: Dec. 27, 2018

(65) Prior Publication Data
US 2019/0206456 A1 Jul. 4, 2019

Related U.S. Application Data

(63) Continuation of application No. 15/485,059, filed on Apr. 11, 2017, now Pat. No. 10,199,080.

(51) Int. Cl.
*G11C 7/00* (2006.01)
*G11C 7/12* (2006.01)
(Continued)

(52) U.S. Cl.
CPC .............. *G11C 7/12* (2013.01); *G11C 7/067* (2013.01); *G11C 7/106* (2013.01); *G11C 7/1006* (2013.01);
(Continued)

(58) Field of Classification Search
CPC ....... G11C 11/419; G11C 7/12; G11C 11/413; G11C 11/412; G11C 7/067; G11C 7/1006;
(Continued)

(56) References Cited

U.S. PATENT DOCUMENTS 6,011,743 A 1/2000 Khang
6,856,547 B2 2/2005 Poidomani et al.
(Continued)

OTHER PUBLICATIONS

Notice of Allowance dated Sep. 24, 2018 for U.S. Appl. No. 15/485,059, 8 pages.
(Continued)

*Primary Examiner* — Toan K Le
(74) *Attorney, Agent, or Firm* — Schwabe, Williamson & Wyatt, P.C.

(57) ABSTRACT

Apparatuses, methods and storage media associated with single-ended sensing array design are disclosed herein. In embodiments, a memory device may include bitcell arrays, clipper circuitry, read merge circuitry, and a set dominant latch (SDL). The clipper circuitry may be coupled to a read port node of a first bitcell array of the bitcell arrays and a local bitline (LBL) node, the clipper circuitry to provide a voltage drop between the read port node and the LBL node. The read merge circuitry coupled to the clipper circuitry at the LBL node, the read merge circuitry to drive a value of a global bitline (GBL) node based on a value of the LBL node. The SDL coupled to the GBL node to sense the value of the GBL node. Other embodiments may be described and/or claimed.

23 Claims, 17 Drawing Sheets

(51) Int. Cl.

| | | |
|---|---|---|
| *G11C 11/419* | (2006.01) | |
| *G11C 7/06* | (2006.01) | |
| *G11C 7/10* | (2006.01) | |
| *G11C 7/18* | (2006.01) | |
| *G11C 8/16* | (2006.01) | |
| *G11C 11/412* | (2006.01) | |
| *G11C 15/04* | (2006.01) | |

(52) U.S. Cl.
CPC ............. *G11C 7/1012* (2013.01); *G11C 7/18* (2013.01); *G11C 8/16* (2013.01); *G11C 11/412* (2013.01); *G11C 11/419* (2013.01); *G11C 15/04* (2013.01)

(58) Field of Classification Search
CPC ..... G11C 7/1002; G11C 7/1012; G11C 7/106; G11C 7/18; G11C 7/16; G11C 15/04
See application file for complete search history.

(56) References Cited

U.S. PATENT DOCUMENTS

| | | | |
|---|---|---|---|
| 6,999,372 B2 | 2/2006 | Takayanagi | |
| 8,488,390 B2 | 7/2013 | Kulkarni et al. | |
| 9,947,388 B2 | 4/2018 | Kulkarni et al. | |
| 10,199,080 B2 * | 2/2019 | Kulkarni | ........... G11C 7/12 |
| 2007/0236256 A1 | 10/2007 | Cherukuri et al. | |
| 2008/0310246 A1 | 12/2008 | Joshi et al. | |
| 2013/0003469 A1 | 1/2013 | Kulkarni et al. | |
| 2014/0169089 A1 | 6/2014 | Castro | |
| 2014/0169109 A1 | 6/2014 | Donkoh | |
| 2015/0009751 A1 | 1/2015 | Kulkarni et al. | |
| 2015/0213858 A1 | 7/2015 | Tao et al. | |
| 2017/0270998 A1 | 9/2017 | Kulkarni et al. | |

OTHER PUBLICATIONS

Non-Final Office Action dated Nov. 3, 2016 for U.S. Appl. No. 15/072,278, 15 pages.
Final Office Action dated Apr. 20, 2017 for U.S. Appl. No. 15/072,278, 14 pages.
Notice of Allowance dated Jul. 17, 2017 for U.S. Appl. No. 15/072,278, 8 pages.
International Search Report and Written Opinion dated May 12, 2017 for International Application No. PCT/US2017/016050, 12 pages.
Final Office Action dated Sep. 15, 2017 for U.S. Appl. No. 15/072,278, 14 pages.
Notice of Allowance dated Dec. 14, 2017 for U.S. Appl. No. 15/072,278, 9 pages.
Non-Final Office Action dated Mar. 14, 2018 for U.S. Appl. No. 15/485,059, 22 pages.

* cited by examiner

US 10,685,688 B2

LOW SWING BITLINE FOR SENSING ARRAYS

RELATED APPLICATIONS

This application is a continuation application of U.S. patent application Ser. No. 15/485,059, entitled "LOW SWING BITLINE FOR SENSING ARRAYS", filed Apr. 11, 2017, the disclosure of which is hereby fully incorporated by reference in its entirety.

TECHNICAL FIELD

The present disclosure relates to the field of electronic circuits. More particularly, the present disclosure relates to low swing bitline design for single-ended sensing arrays.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Legacy single-ended sensing arrays (such as register files, read-only memories, and content addressable memories) may include multiple bitcells with read ports of the multiple bitcells coupled to a set dominant latch via merge circuitry that merges the values of the read ports. The legacy single-ended sensing arrays may include a single voltage that is supplied to the bitcells, the set dominant latch, and the merge circuitry. The voltage is required to be above a certain minimum voltage to ensure proper operation of all of the bit cells, the set dominant latch, and the merge circuitry.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
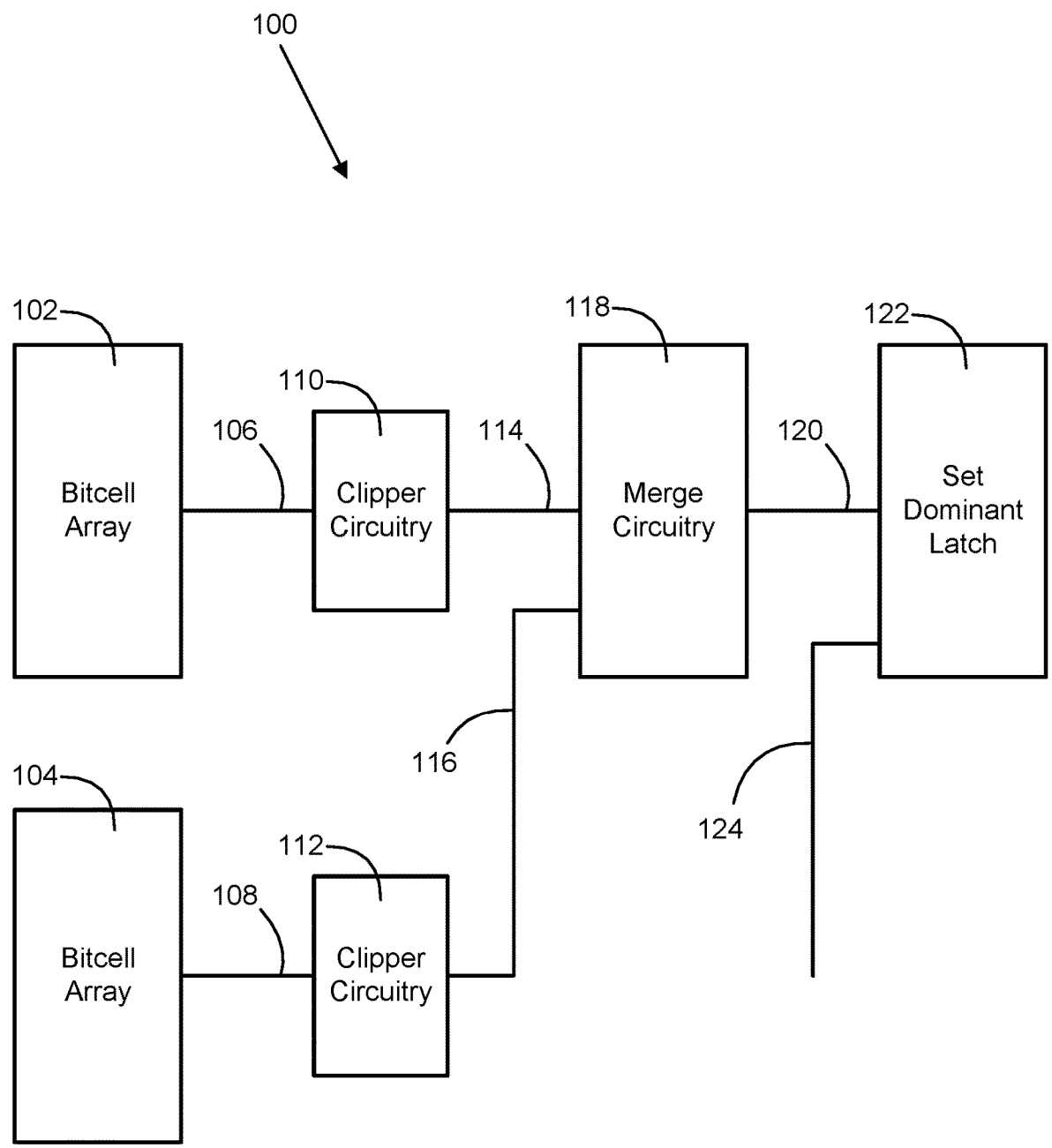
FIG. 1 illustrates a block diagram of an example single-ended sensing array, according to various embodiments.

Apparatuses, methods and storage media associated with single-ended sensing array design are disclosed herein. In embodiments, a memory device may include bitcell arrays, clipper circuitry, read merge circuitry, and a set dominant latch (SDL). The clipper circuitry may be coupled to a read port node of a first bitcell array of the bitcell arrays and a local bitline (LBL) node, the clipper circuitry to provide a voltage drop between the read port node and the LBL node. The read merge circuitry may be coupled to the clipper circuitry at the LBL node, the read merge circuitry to drive a value of a global bitline (GBL) node based on a value of the LBL node. The SDL may be coupled to the GBL node to sense the value of the GBL node.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein referring to transistors throughout, "activated" and "deactivated" may refer to the conduction of electrical current through the transistors. In the activated state, the transistor may conduct electrical current between the source terminal (or collector terminal) and the drain terminal (or emitter terminal) of the transistor. In the deactivated state, the transistor may not conduct electrical current between the source terminal (or collector terminal) and the drain terminal (or emitter terminal) of the transistor. In some embodiments, the transistor may conduct a small amount of leakage current between the source terminal (or collector terminal) and the drain terminal (or emitter terminal) of the transistor when in the deactivated state.

As used herein, "logic high" may refer to a voltage range corresponding to a binary one of the circuitry and/or the computer device (such as the computer device 1700 (FIG. 17)). The voltage range for the logic high may be above a transition voltage, the transition voltage corresponding to a transition point between the logic high and a logic low. The voltage range may include a supply voltage supplied by a supply rail (such as the supply rail 406 (FIG. 4)).

As used herein, "logic low" may refer to a voltage range corresponding to a binary zero of the circuitry and/or the computer device (such as the computer device 1700 (FIG. 17)). The voltage range for the logic low may be below a transition voltage, the transition voltage corresponding to a transition point between the logic high and a logic low. The voltage range may include a zero voltage potential as supplied by ground (such as the ground 428 (FIG. 4)).

FIG. 1 illustrates a block diagram of an example single-ended sensing array 100, according to various embodiments. The single-ended sensing array 100 may be embodied within and/or implemented by a memory device, register files, read-only memories, content addressable memories, or some combination thereof. The single-ended sensing array 100 may include one or more bitcell arrays, such as bitcell array 102 and bitcell array 104. Each of the bitcell arrays may include one or more bitcells. Each of the bitcells may store a bit and provide the bit to a read port node, such as read port node 106 and read port node 108 when the bitcell is selected to be read. One of the bitcells may be selected to be read at a time, wherein the bitcell array corresponding with the bitcell may output a value to the read port node corresponding to the value of the bitcell being read.

The single-ended sensing array 100 may include clipper circuitry, such as clipper circuitry 110 and clipper circuitry 112. The clipper circuitry may include circuitry to generate a voltage differential between the corresponding read port node and a local bitline (LBL) node, such as LBL node 114 and second LBL node 116, coupled to the clipper circuitry 110. The clipper circuitry may maintain the voltage of the LBL node at a voltage higher than a voltage of the corresponding read port node when the clipper circuitry is activated. In some embodiments, the clipper circuitry may include one or more transistors coupled in series, wherein a total voltage drop from the LBL node to the corresponding read port node may be equal to the sum of the threshold voltages of the transistors. In some embodiments, the voltage drop across the transistors may be less than the threshold voltages of the transistors and the total voltage drop from the LBL node to the corresponding read port node may be equal to voltage drops of each of the transistors coupled in series. The transistors may be metal-oxide semiconductor field-effect transistors (MOSFETs) with a source terminal of a transistor coupled to a drain terminal of an adjacent transistor within the series of transistors.

The single-ended sensing array 100 may further include read merge circuitry 118. The read merge circuitry 118 may be coupled to the LBL node 114 and the second LBL node 116. The read merge circuitry 118 may merge inputs from the LBL node 114 and the second LBL node 116 into a single output, which may drive a global bitline (GBL) 120. In some embodiments, the clipper circuitry, such as the clipper circuitry 110 and/or the clipper circuitry 112, may be included in the read merge circuitry 118. However, the clipper circuitry and the read merge circuitry 118 are illustrated as separate features in FIG. 1 to clearly illustrate the LBL node 114 and the second LBL node 116.

The single-ended sensing array 100 may further include a set dominant latch (SDL) 122. The SDL 122 may receive the GBL 120 and sense the value on the GBL 120. Further, the SDL 122 may merge the value of the GBL 120 with one or more other GBLs, such as GBL 124, to produce a single output value. The other GBLs, including GBL 124, may be coupled to other read merge circuitry, which may be coupled to other clipper circuitry and other bitcell arrays. The SDL 122 may output the single output value. In some embodiments, the single output value may be output to a latch and/or flip-flop.

Figure 2:
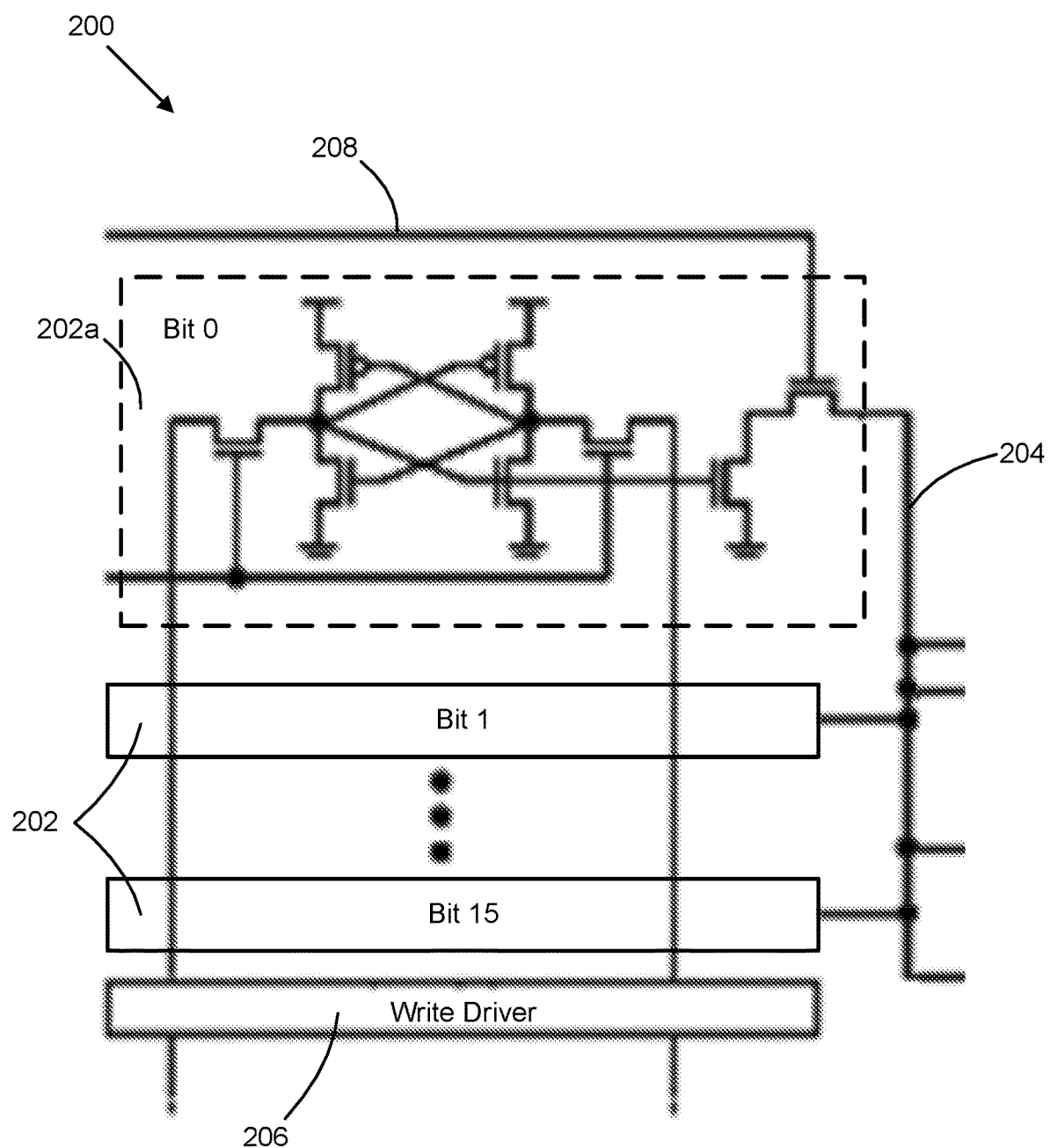
FIG. 2 illustrates an example bitcell array, according to various embodiments.

FIG. 2 illustrates an example bitcell array 200, according to various embodiments. The bitcell array 200 may be representative of the bitcell array 102 (FIG. 1) and bitcell array 104 (FIG. 1). The bitcell array 200 may include one or more bitcells 202. Each of the bitcells 202 may store a value for a bit and may output the value of the bit to a read port node 204 in response to the bitcell 202 receiving a read signal.

Bitcell 202*a* is illustrated in detail to provide for further description. The bitcell 202*a* may be representative of the other bitcells 202. The bitcell 202*a* may include storage circuitry 204. The storage circuitry 204 may receive a value corresponding to a bit from a write driver 206 and store the value. In response to receiving a read signal on a read line 208, the bitcell 202*a* may output the stored value to the read port node 204. One of the bitcells 202 within the bitcell array 200 may receive a read signal at a time, with the bitcell 202 that receives the read signal providing its stored value to the read port node 204.

Figure 3:
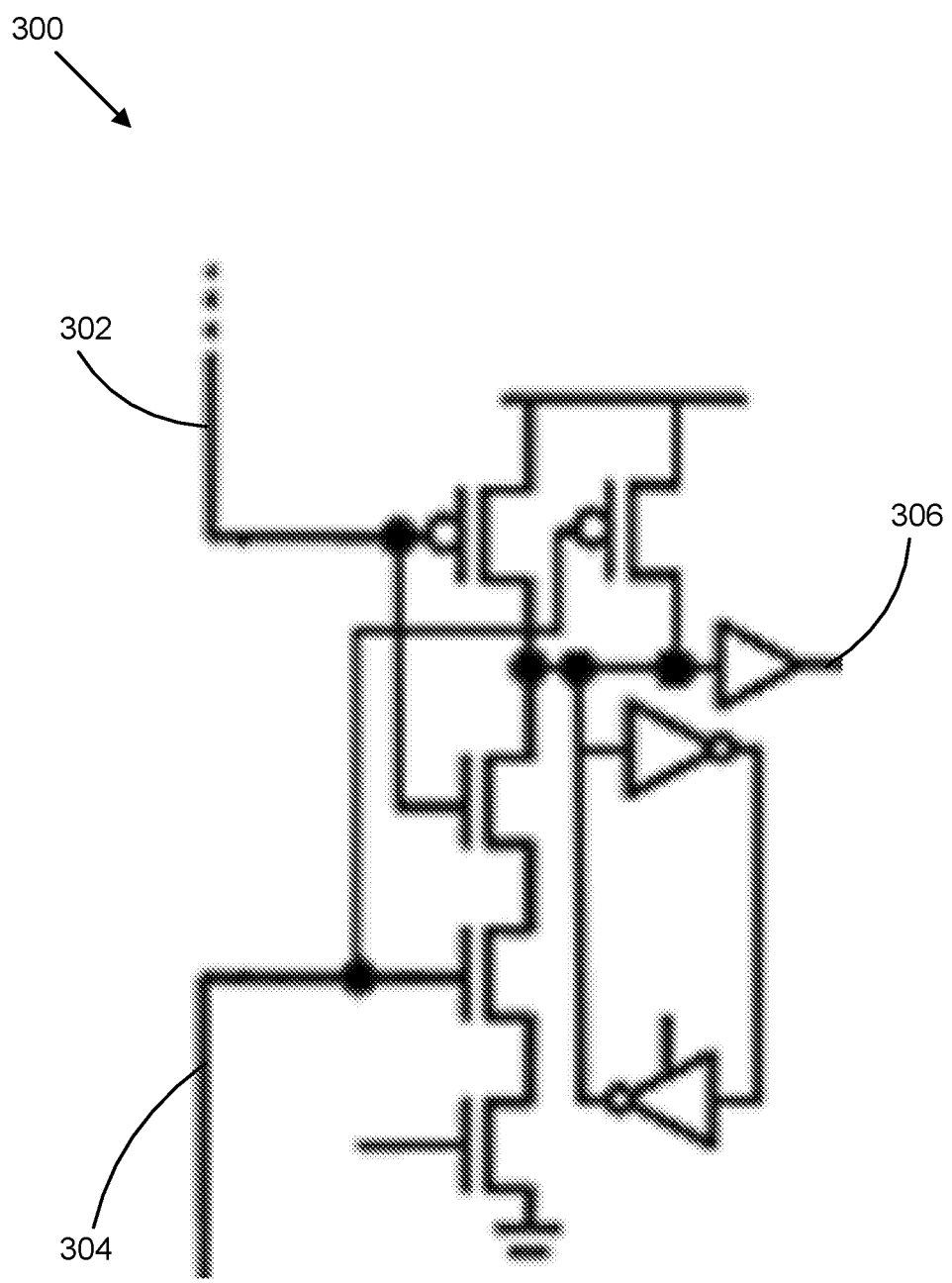
FIG. 3 illustrates an example set dominant latch, according to various embodiments.

FIG. 3 illustrates an example SDL 300, according to various embodiments. The SDL 300 may be representative of the SDL 122 (FIG. 1). The SDL 300 may be coupled to one or more GBLs, such as a first GBL 302 and a second GBL 304. The SDL 300 may sense a first value on the first GBL 302 and may sense a second value on the second GBL 304. The SDL 300 may merge the first value and the second value and may output either the first value or the second value on output node 306. In particular, one of first GBL 302 and the second GBL 304 may drive the output node 306 at a time. A dominant one of the first GBL 302 and the second GBL 304 may drive the output node 306 in situations where the first GBL 302 and the second GBL 304 attempt to drive the output node 306 at the same time. In some embodiments, the output node 306 may be coupled to a latch and/or a flipflop.

Figure 4:
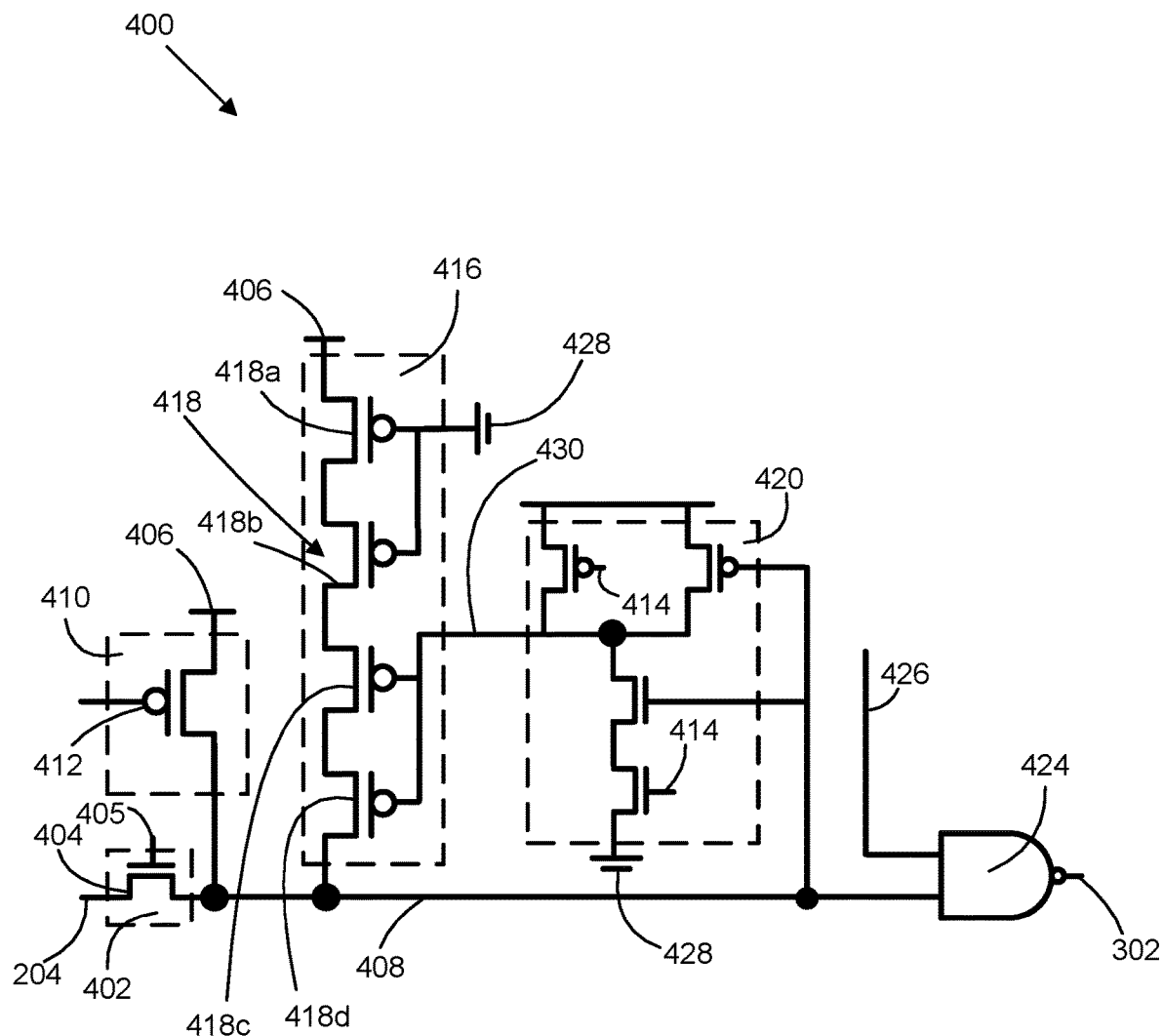
FIG. 4 illustrates a first example of read merge circuitry, according to various embodiments.

FIG. 4 illustrates a first example of read merge circuitry 400, according to various embodiments. The read merge circuitry 400 may include clipper circuitry 402. The read merge circuitry 400 may be representative of the read merge circuitry 118 (FIG. 1), and the clipper circuitry 402 may be representative of the clipper circuitry 110 (FIG. 1) and/or the clipper circuitry 112 (FIG. 1).

The clipper circuitry 402 may include a transistor 404. The transistor 404 may include be a MOSFET. The gate terminal of the transistor 404 may be coupled to a bias node 405. A bias voltage may be applied to the bias node 405, and the bias voltage may be varied during operation of the clipper circuitry 402. The bias voltage may be varied between ground, a supply voltage, and one or more voltages between ground and the supply voltage. The bias voltage may be selected based on a desired voltage drop from the LBL node 408 to the read port node 204. In some embodiments, the bias voltage may be varied between ground and the supply voltage.

The source terminal of the transistor 404 may be coupled to an LBL node 408 and the drain terminal of the transistor 404 may be coupled to a read port node 204. The LBL node 408 may be representative of the LBL 114 (FIG. 1) and/or the LBL 116 (FIG. 1). The transistor 404 may have a threshold voltage and may provide a voltage drop from the LBL node 408 to the read port node 204 equal to the threshold voltage when the transistor 404 is activated. The transistor 404 may be activated when a voltage of the LBL node 408 exceeds the threshold voltage, including when the LBL node 408 is set to a voltage corresponding to a logic high. The logic high may be equal to the supply voltage received at the supply rail 406.

In some embodiments, the voltage drop from the LBL node 408 to the read port node 204 provided by the transistor 404 may be between zero volts and the threshold voltage when the bias voltage applied to the gate of the transistor 404 is between ground and the supply voltage. In this instance, the transistor 404 may be activated when the voltage of the LBL node 408 exceeds the voltage drop to be provided by the transistor 404.

The read port node 204 may be coupled to a bitcell array 200 (FIG. 2), as illustrated in FIG. 2. Due to the value of the read port node 204 being a voltage drop below the LBL node 408 when the clipper circuitry 402 is activated, the voltage of the read port node 204 may be less than a voltage corresponding to a logic high when the LBL node 408 is set to a logic high. For example, the voltage of the read port node 204 may be equal to the voltage corresponding to the logic high minus the voltage drop when the LBL node 408 is set to logic high.

Further, when the LBL node 408 is set to a logic low, the voltage of the LBL node 408 may drop below the threshold voltage of the transistor 404 and the transistor 404 may be deactivated. When the transistor 404 is deactivated, the voltage of the read port node 204 may be equal to the voltage of the LBL node 408. For example, when the voltage of the LBL node 408 is set to zero volts, corresponding to a logic low, the voltage of the read port node 204 may be equal to zero volts.

Accordingly, during operation, the voltage of the read port node 204 may swing between a low value of zero volts and a high value of the voltage corresponding to a logic high minus the voltage drop. In legacy single-ended sensing arrays, a read port node typically swings between zero volts and a voltage corresponding to the logic high. The decreased swing of the read port node 204 of the disclosed merge circuitry 400 may provide for energy savings. For example, less energy may be used to raise the voltage of the read port node 204 to the voltage corresponding to a logic high minus the voltage drop than raising the read port node 204 to the voltage corresponding to the logic high. Further, less energy may be dissipated as the read port node 204 transitions from voltage corresponding to the logic high to zero volts. Additionally, utilizing the transistor 404 between the read port node 204 and the LBL 408 may lower the switching dynamic capacitance presented when switching between the logic high and the logic low.

The merge circuitry 400 may further include precharge circuitry 410. The precharge circuitry 410 may be coupled to the LBL node 408 and may precharge the LBL node 408 to the supply voltage. The precharge circuitry 410 may include a transistor 412 with the drain terminal of the transistor 412 coupled to the supply rail 406 and the source terminal of the transistor 412 coupled to the LBL node 408. The gate terminal of the transistor 412 may be coupled to a precharge node 414 and, in response to receiving a precharge signal at the precharge node 414, the transistor 412 may precharge the LBL node 408 to the supply voltage.

The merge circuitry 400 may further include keeper circuitry 416. The keeper circuitry 416 may be coupled to the LBL node 408 and may maintain a value of the LBL node 408. The keeper circuitry 416 may include one or more transistors 418. In the illustrated embodiment, the one or more transistors 418 include transistor 418a, transistor 418b, transistor 418c, and transistor 418d. In embodiments having more than one of the transistors 418, the transistors 418 may be coupled in series with a drain terminal of one of the transistors 418 coupled to a source terminal of an adjacent one of the transistors 418. The transistors 418 may be referred to as a keeper stack when there is more than one of the transistors 418.

The keeper circuitry 416 may further be coupled to the supply rail 406. The transistors 418 of the keeper circuitry 416 may be coupled in series between the supply rail 406 and the LBL node 408. The transistor 418a and the transistor 418b adjacent to the coupling to the supply rail 406 may have gate terminals coupled to ground 428, whereas the transistor 418c and the transistor 418d may have gate terminals coupled to a first NAND gate 420 (as is described below). In the illustrated embodiment, the transistor 418a and the transistor 418b adjacent to the coupling to the supply rail 406 may have gate terminals coupled to ground 428 and the transistor 418c and the transistor 418d may have gate terminals coupled to the first NAND gate 420.

The merge circuitry 400 may further include the first NAND gate 420. The first NAND gate 420 may be coupled to the precharge node 414 and the LBL node 408. The first NAND gate 420 may perform a NAND operation on values received from the precharge node 414 and the LBL node 408 and output a resultant value from the NAND operation on an output node 430. The output node 430 may be coupled to gate terminals of one or more of the transistors 418 of the keeper circuitry 416. In the illustrated embodiment, the output node 430 is coupled to the transistor 418c and the transistor 418d of the keeper circuitry 416.

The output of the first NAND gate 420 may control operation of the one or more of the transistors 418, wherein the one or more of the transistors 418 may be activated and deactivated based on the output of the first NAND gate 420. In response to the first NAND gate 420 deactivating the transistor 418c and the transistor 418d, the transistor 418c and the transistor 418d may prevent the transistor 418a and the transistor 418b from conducting current and coupling the LBL node 408 to the supply rail 406. Further, in response to the first NAND gate 420 activating the transistor 418c and the transistor 418d, the transistor 418a and the transistor 418b may conduct current and couple the LBL node 408 to the supply rail 406.

The merge circuitry 400 may further include a second NAND gate 424. The second NAND gate 424 may be coupled to the LBL node 408 and to a second LBL node 426. The second LBL node 426 may be coupled to a second bitcell array. The second bitcell array may include one or more of the features of the bitcell array 200 (FIG. 2). Further, the second bitcell may be directly coupled to the second NAND gate 424 or coupled to the second NAND gate 424 via clipper circuitry (such as the clipper 402), merge circuitry (such as the merge circuitry 400), an SDL (such as the SDL 300 (FIG. 3)), or some combination thereof. The second NAND gate 424 may perform a NAND operation on a first value received from the LBL node 408 and a second value from the second LBL node 426. An output of the NAND gate 422 may drive a GBL 302. In some embodiments, the output of the NAND gate 422 may be coupled to a gate terminal of a drive transistor that drives the GBL 302. The drive transistor may be a MOSFET.

Figure 5:
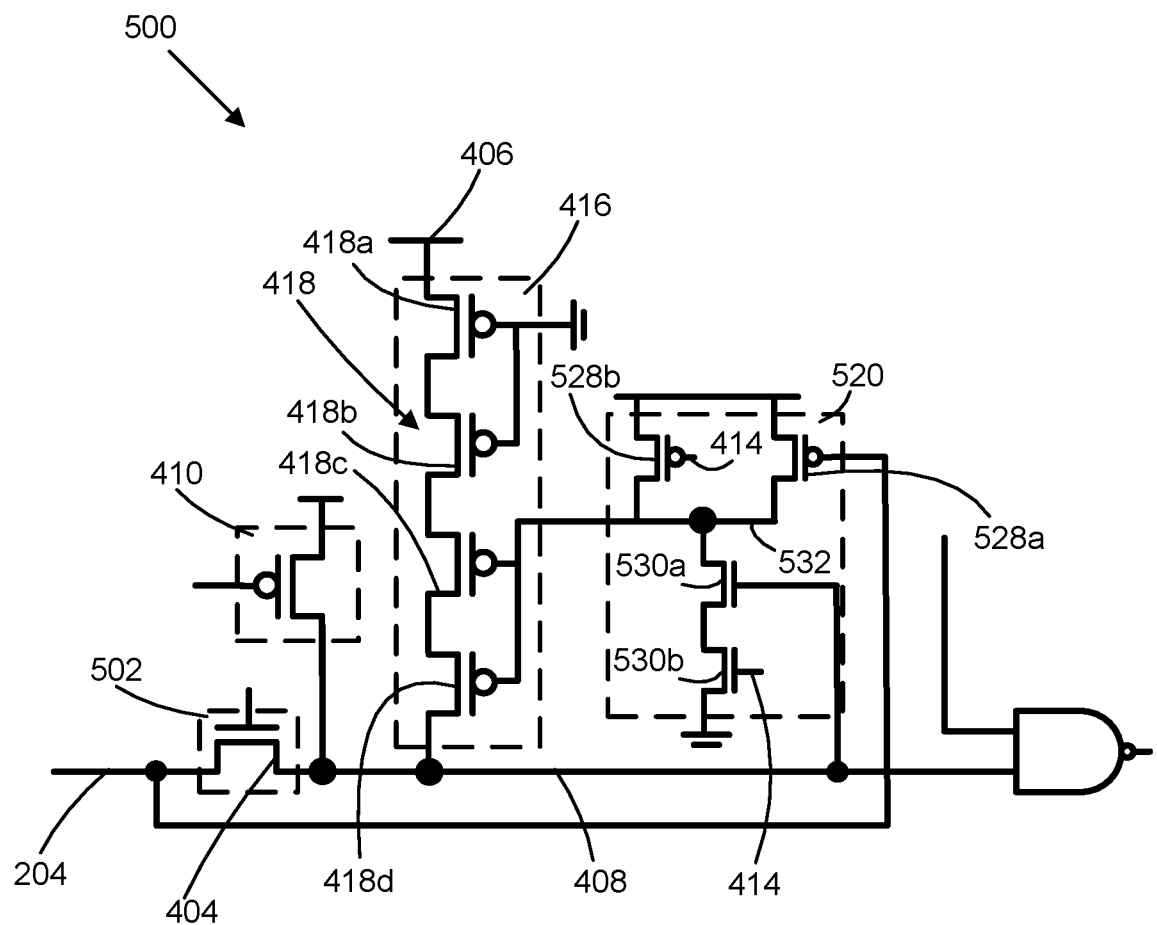
FIG. 5 illustrates a second example of read merge circuitry, according to various embodiments.

FIG. 5 illustrates a second example of read merge circuitry 500, according to various embodiments. The read merge circuitry 500 may include the features of the read merge circuitry 400 (FIG. 4) (including the clipper circuitry 402 (FIG. 4), the precharge circuitry 410 (FIG. 4), the keeper circuitry 416 (FIG. 4), the first NAND gate 420 (FIG. 4), the second NAND gate 424 (FIG. 4), or some combination thereof). The read merge circuitry 500 may be representative of the read merge circuitry 118 (FIG. 1), and clipper circuitry 502 may be representative of the clipper circuitry 110 (FIG. 1) and/or the clipper circuitry 112 (FIG. 1).

The read merge circuitry 500 may include clipper circuitry 502. The clipper circuitry 502 may include one or more of the features of the clipper circuitry 402 (FIG. 4), including the transistor 404 located between the read port node 204 and the LBL node 408. The transistor 404 may have a threshold voltage and may provide a voltage drop from the LBL node 408 to the read port node 204 equal to the threshold voltage when the transistor 404 is activated.

In some embodiments, the voltage drop from the LBL node 408 to the read port node 204 provided by the transistor 404 may be between zero volts and the threshold voltage when the bias voltage applied to the gate of the transistor 404 is between ground and the supply voltage. In this instance, the transistor 404 may be activated when the voltage of the LBL node 408 exceeds the voltage drop to be provided by the transistor 404.

The read merge circuitry 500 may further include a first NAND gate 520. The first NAND gate 520 may include one or more of the features of the first NAND gate 420 (FIG. 4). The first NAND gate 520 may be coupled to the precharge node 414, the LBL node 408, the read port node 204, or some combination thereof. In particular, the read port node 204 may be coupled to transistor 528a within the first NAND gate 520, while the transistor 528b may be coupled to the precharge node 414. Transistor 530a and transistor 530b may be coupled in series between an output node 532 of the first NAND gate 520 and ground 428. A gate terminal of transistor 530a may be coupled to the LBL node 408 and a gate terminal of transistor 530b may be coupled to the precharge node 414.

Coupling the read port node 204 to the transistor 528a may cause the first NAND gate 520 to transition the output node 532 to a logic high sooner during discharge from a precharge phase (performed by precharge circuitry 410) than if the transistor 528a was coupled to the LBL node 408. In particular, due to the read port node 204 being a voltage drop lower than the LBL node 408, a voltage at the gate terminal of the transistor 528a may reach a transition voltage (where the transistor 528a transitions between activated and deactivated states) sooner during discharge than if the LBL node 408 was coupled to the gate terminal. In response to the voltage at the gate terminal of the transistor 528a dropping below the transition voltage, the transistor 528a may transition to an activated state.

In response to the transistor 528a transitioning to the activated state, the output node 532 of the first NAND gate 520 may transition to a logic high. The output node 532 may be coupled to a portion of the transistors 418 of the keeper circuitry 416. In the illustrated embodiment, the output node 532 may be coupled to the transistor 418c and the transistor 418d. One or more of the transistors 418 adjacent to the coupling to the supply rail 406 may have gate terminals coupled to ground 428, whereas the other transistors 418 may have gate terminals coupled to output node 532 of the first NAND gate 520. In the illustrated embodiment, the transistor 418a and the transistor 418b adjacent to the coupling to the supply rail 406 may have gate terminals coupled to ground 428 and the transistor 418c and the transistor 418d may have gate terminals coupled to output node 532.

Due to the output node 532 transitioning to the logic high earlier than if the gate terminal of the transistor 528 was coupled to the LBL node 408, the transistor 418c and the transistor 418d may transition to a deactivated state earlier. The transistor 418c and the transistor 418d transitioning to the deactivated state may cause the transistor 418a and the transistor 418b to transition to the deactivated state. During the activated state, the transistors 418 may experience voltage stress across the gate oxide of the transistors 418, which may degrade the transistors 418 (referred to as 'aging' of the transistors 418) and reduce the ability of the transistors 418 to withstand noise events. Due to the transistors 418 transitioning to the deactivated state earlier, the voltage stress the transistors 418 experience may be decreased and the degradation of the transistors 418 may be decreased.

Figure 6:
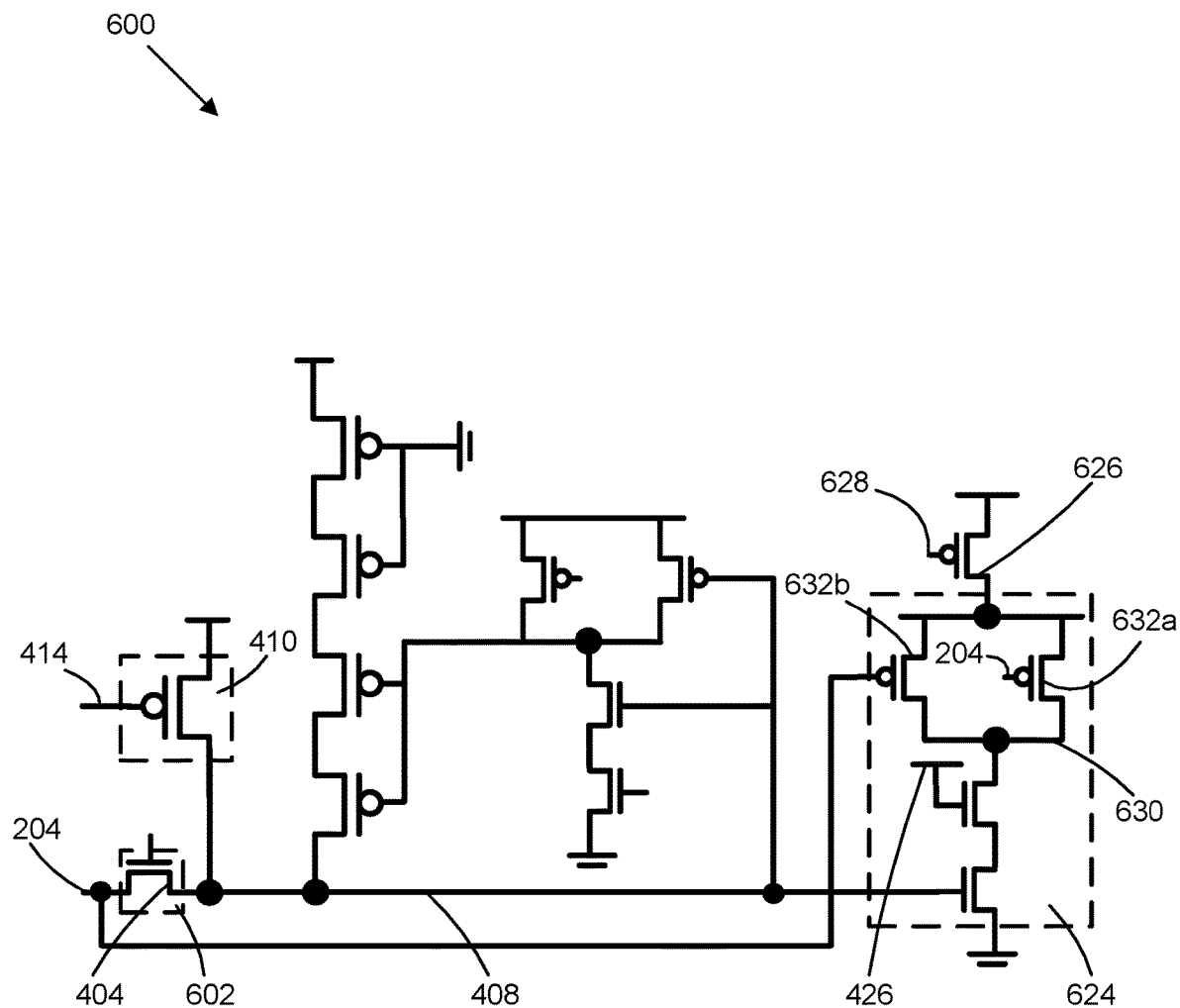
FIG. 6 illustrates a third example of read merge circuitry, according to various embodiments.

FIG. 6 illustrates a third example of read merge circuitry 600, according to various embodiments. The read merge circuitry 600 may include the features of the read merge circuitry 400 (FIG. 4) (including the clipper circuitry 402 (FIG. 4), the precharge circuitry 410 (FIG. 4), the keeper circuitry 416 (FIG. 4), the first NAND gate 420 (FIG. 4), the second NAND gate 424 (FIG. 4), or some combination thereof). The read merge circuitry 600 may be representative of the read merge circuitry 118 (FIG. 1), and clipper circuitry 602 may be representative of the clipper circuitry 110 (FIG. 1) and/or the clipper circuitry 112 (FIG. 1).

The read merge circuitry 600 may include clipper circuitry 602. The clipper circuitry 602 may include one or more of the features of the clipper circuitry 402 (FIG. 4), including the transistor 404 located between the read port node 204 and the LBL node 408. The transistor 404 may have a threshold voltage and may provide a voltage drop from the LBL node 408 to the read port node 204 equal to the threshold voltage when the transistor 404 is activated.

In some embodiments, the voltage drop from the LBL node 408 to the read port node 204 provided by the transistor 404 may be between zero volts and the threshold voltage when the bias voltage applied to the gate of the transistor 404 is between ground and the supply voltage. In this instance, the transistor 404 may be activated when the voltage of the LBL node 408 exceeds the voltage drop to be provided by the transistor 404.

The read merge circuitry 600 may include second NAND gate 624. The second NAND gate 624 may include one or more of the features of the second NAND gate 424 (FIG. 4). The second NAND gate 624 may be coupled to the LBL node 408, the second LBL node 426, the read port node 204, or some combination thereof. The second NAND gate 624 may be further coupled to a header transistor 626 coupled to an inverted precharge node 628 (which has a value equal to the logical inverse of the precharge node 414), wherein the header transistor 626 may cause a GBL node 630 to be a logic low when the header transistor 626 is deactivated. The header transistor 626 may prevent the second NAND gate 624 from short-circuiting during a precharge phase (performed by precharge circuitry 410).

The read port node 204 may be coupled to gate terminals of both of transistor 632a and transistor 632b. Coupling the read port node 204 to the transistor 632a and the transistor 632b may cause the second NAND gate 624 to transition the GBL 630 to a logic high sooner during discharge from a precharge phase than if the transistor 632a and the transistor 632b were coupled to the LBL node 408. In particular, due to the read port node 204 being a voltage drop lower than the LBL node 408, a voltage at the gate terminals of the transistor 632a and the transistor 632b may reach a transition voltage (where the transistor 632a and the transistor 632b transition between activated and deactivated states) sooner during discharge than if the LBL node 408 was coupled to the gate terminals. In response to the voltage at the gate terminals of the transistor 632a and the transistor 632b dropping below the transition voltage, the transistor 632a and the transistor 632b may transition to an activated state.

In response to the transistor 632a and the transistor 632b transitioning to the activated state, the GBL node 630 of the second NAND gate 624 may transition to a logic high. Based on the GBL node 630 transitioning to a logic high sooner, a speed at which the GBL node 630 is evaluated may be increased. The GBL node 630 may be evaluated by a SDL (such as the SDL 300 (FIG. 3)) coupled to the GBL node 630.

Figure 7:
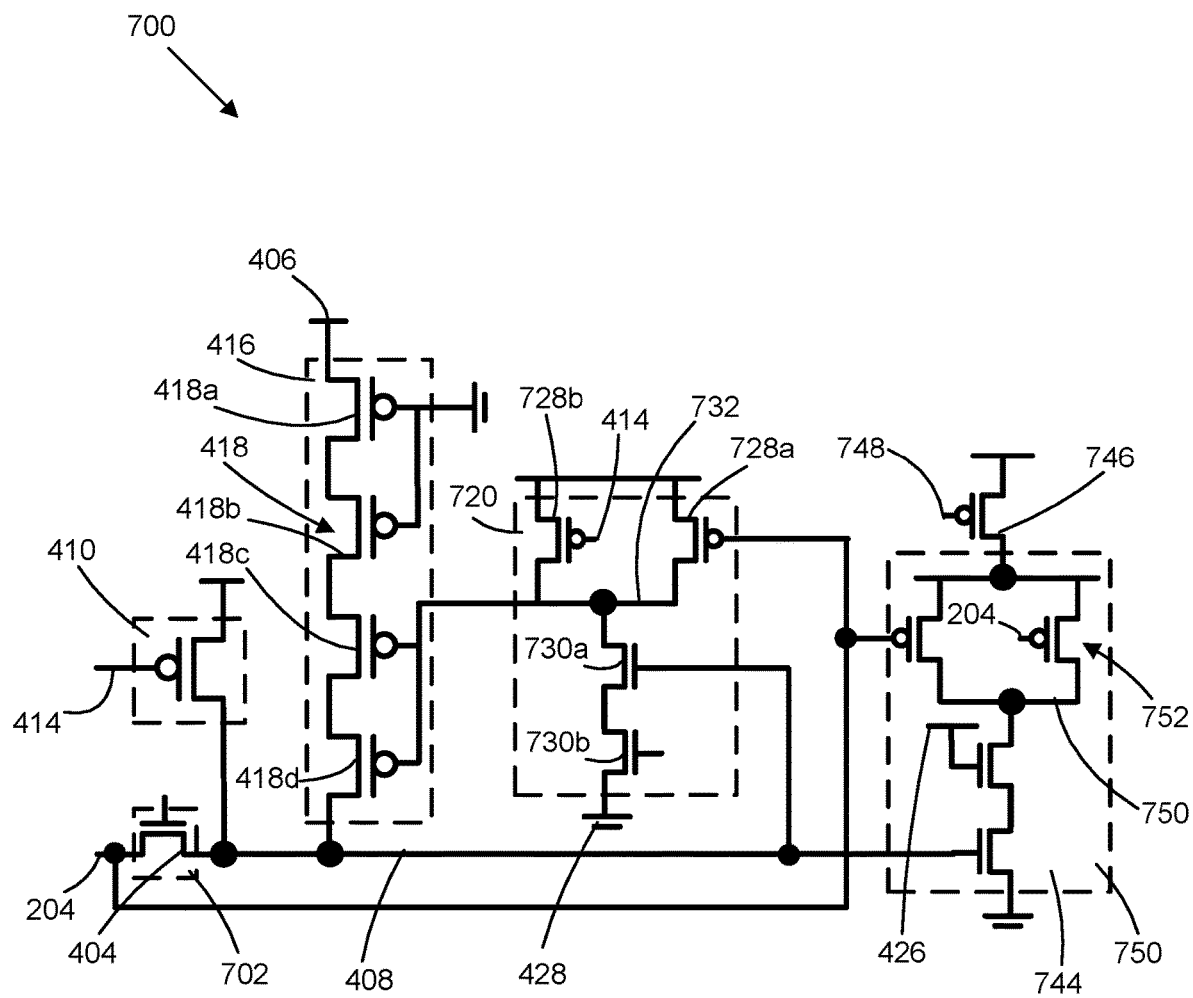
FIG. 7 illustrates a fourth example of read merge circuitry, according to various embodiments.

FIG. 7 illustrates a fourth example of read merge circuitry 700, according to various embodiments. The read merge circuitry 700 may include the features of the read merge circuitry 400 (FIG. 4) (including the clipper circuitry 402 (FIG. 4), the precharge circuitry 410 (FIG. 4), the keeper circuitry 416 (FIG. 4), the first NAND gate 420 (FIG. 4), the second NAND gate 424 (FIG. 4), or some combination thereof). The read merge circuitry 700 may be representative of the read merge circuitry 118 (FIG. 1), and clipper circuitry 702 may be representative of the clipper circuitry 110 (FIG. 1) and/or the clipper circuitry 112 (FIG. 1).

The read merge circuitry 700 may include clipper circuitry 702. The clipper circuitry 702 may include one or more of the features of the clipper circuitry 402 (FIG. 4), including the transistor 404 located between the read port node 204 and the LBL node 408. The transistor 404 may have a threshold voltage and may provide a voltage drop from the LBL node 408 to the read port node 204 equal to the threshold voltage when the transistor 404 is activated.

In some embodiments, the voltage drop from the LBL node 408 to the read port node 204 provided by the transistor 404 may be between zero volts and the threshold voltage when the bias voltage applied to the gate of the transistor 404 is between ground and the supply voltage. In this instance, the transistor 404 may be activated when the voltage of the LBL node 408 exceeds the voltage drop to be provided by the transistor 404.

The read merge circuitry 700 may further include a first NAND gate 720. The first NAND gate 720 may include one or more of the features of the first NAND gate 420 (FIG. 4). The first NAND gate 720 may be coupled to the precharge node 414, the LBL node 408, the read port node 204, or some combination thereof. In particular, the read port node 204 may be coupled to transistor 728a, while transistor 728b may be coupled to the precharge node 414. Transistor 730a and transistor 730b may be coupled between an output node 732 of the first NAND gate 720 and ground 428. The transistor 730a may be coupled to the LBL node 408 and transistor 730a may be coupled to the precharge node 414.

Coupling the read port node 204 to the transistor 728a may cause the first NAND gate 720 to transition the output node 732 to a logic high sooner during discharge from a precharge phase (performed by precharge circuitry 410) than if the transistor 728a were coupled to the LBL node 408. In particular, due to the read port node 204 being a voltage drop lower than the LBL node 408, a voltage at the gate terminal of the transistor 728a may reach a transition voltage (where the transistor 728a transitions between activated and deactivated states) earlier during discharge than if the LBL node 408 was coupled to the gate terminal. In response to the voltage at the gate terminal of the transistor 728a dropping below the transition voltage, the transistor 728a may transition to an activated state.

In response to the transistor 728a transitioning to the activated state, the output node 732 of the first NAND gate 720 may transition to a logic high. The output node 732 may be coupled to a portion of the transistors 418 of the keeper circuitry 416. One or more of the transistors 418 adjacent to the coupling to the supply rail 406 may have gate terminals coupled to ground 428, whereas the other transistors 418 may have gate terminals coupled to output node 732 of the first NAND gate 720. In the illustrated embodiment, the transistor 418a and the transistor 418b adjacent to the coupling to the supply rail 406 may have gate terminals coupled to ground 428 and the transistor 418c and the transistor 418d may have gate terminals coupled to output node 732.

Due to the output node 732 transitioning to the logic high earlier than if the gate terminal of the transistor 728a was coupled to the LBL node 408, the transistor 418c and the transistor 418d may transition to a deactivated state earlier. The transistor 418c and the transistor 418d transitioning to the deactivated state may cause the transistor 418a and the transistor 418b to transition to the deactivated state. During the activated state, the transistors 418 may experience voltage stress across the gate oxide of the transistors 418, which may degrade the transistors 418 (referred to as 'aging' of the transistors 418) and reduce the ability of the transistors 418 to withstand noise events. Due to the transistors 418 transitioning to the deactivated state earlier, the voltage stress the transistors 418 experience may be decreased and the degradation of the transistors 418 may be decreased.

The read merge circuitry 700 may include second NAND gate 744. The second NAND gate 744 may include one or more of the features of the second NAND gate 424 (FIG. 4). The second NAND gate 744 may be coupled to the LBL node 408, the second LBL node 426, and the read port node 204, or some combination thereof. The second NAND gate 744 may be further coupled to a header transistor 746 coupled to an inverted precharge node 748 (which has a value equal to the logical inverse of the precharge node 414), wherein the header transistor 746 may cause a GBL node 750 to be a logic low when the header transistor 746 is deactivated. The header transistor 746 may prevent the second NAND gate 744 from short-circuiting during a precharge phase (performed by precharge circuitry 410).

The read port node 204 may be coupled to gate terminals of both of paired transistors 752. Coupling the read port node 204 to the paired transistors 752 may cause the second NAND gate 744 to transition the GBL 750 to a logic high earlier during discharge from a precharge phase than if the paired transistors 752 were coupled to the LBL node 408. In particular, due to the read port node 204 being a voltage drop lower than the LBL node 408, a voltage at the gate terminal of the paired transistors 752 may reach a transition voltage (where the paired transistors 752 transition between activated and deactivated states) earlier during discharge than if the LBL node 408 was coupled to the gate terminals. In response to the voltage at the gate terminals of the paired transistors 752 dropping below the transition voltage, the paired transistors 752 may transition to an activated state.

In response to the paired transistors 752 transitioning to the activated state, the GBL node 750 of the second NAND gate 744 may transition to a logic high. Based on the GBL node 750 transitioning to a logic high earlier, a speed at which the GBL node 750 is evaluated may be increased. The GBL node 750 may be evaluated by a SDL (such as the SDL 300 (FIG. 3)) coupled to the GBL node 750.

Figure 8:
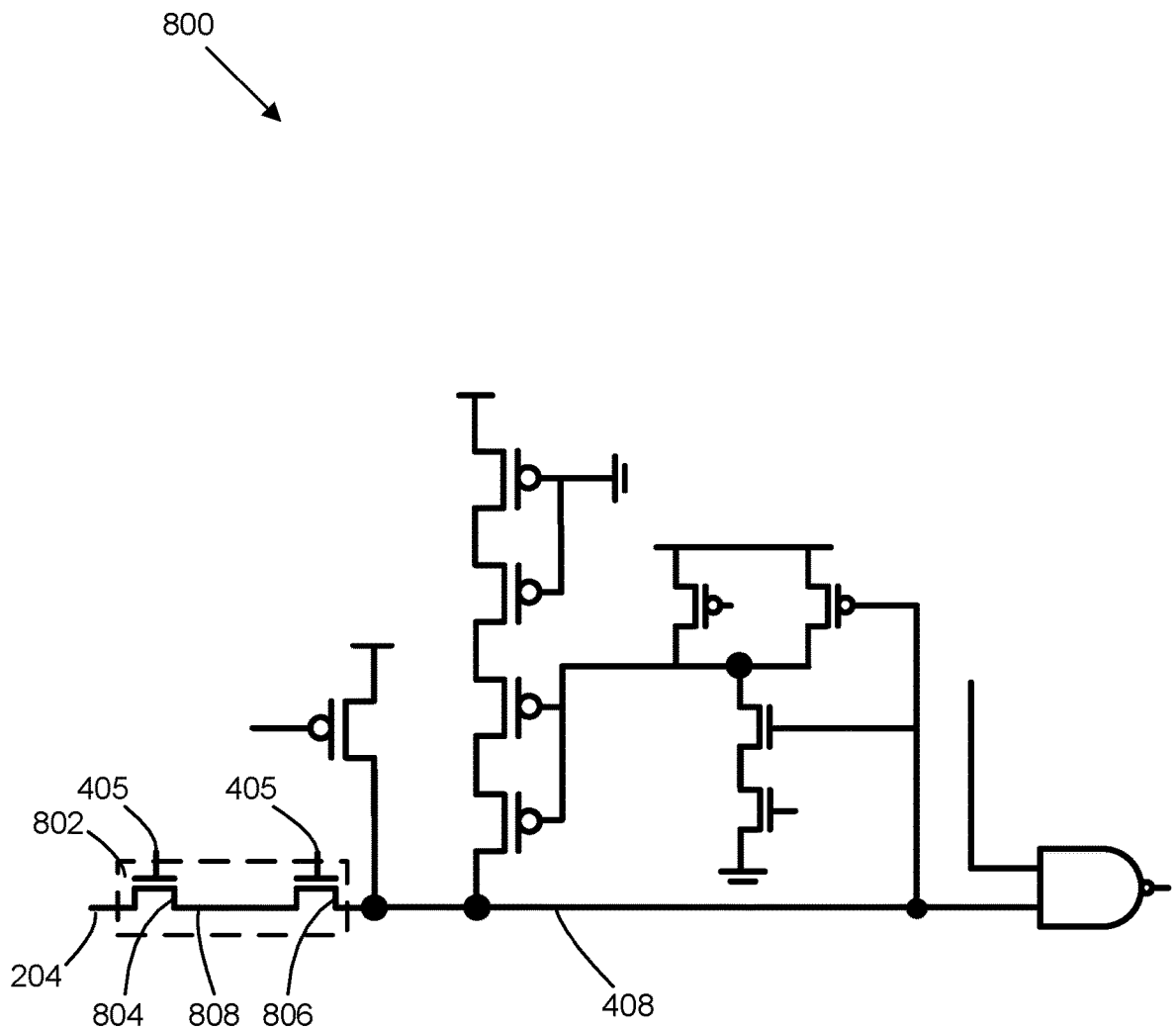
FIG. 8 illustrates a fifth example of read merge circuitry, according to various embodiments.

FIG. 8 illustrates a fifth example of read merge circuitry 800, according to various embodiments. The read merge circuitry 800 may include the features of the read merge circuitry 400 (FIG. 4) (including the clipper circuitry 402 (FIG. 4), the precharge circuitry 410 (FIG. 4), the keeper circuitry 416 (FIG. 4), the first NAND gate 420 (FIG. 4), the second NAND gate 424 (FIG. 4), or some combination thereof). The read merge circuitry 800 may be representative of the read merge circuitry 118 (FIG. 1), and clipper circuitry 802 may be representative of the clipper circuitry 110 (FIG. 1) and/or the clipper circuitry 112 (FIG. 1).

The read merge circuitry 800 may include clipper circuitry 802. The clipper circuitry 802 may include more than one transistor. In the illustrated embodiment, the clipper circuitry 802 may include a first transistor 804 and a second transistor 806. The first transistor 804 and/or the second transistor 806 may include be a MOSFET. The gate terminal of the first transistor 804 and/or the second transistor 806 may be coupled to a bias node 405. A bias voltage may be applied to the bias node 405, and the bias voltage may be varied during operation of the clipper circuitry 802. The bias voltage may be varied between ground, a supply voltage, and one or more voltages between ground and the supply voltage. The bias voltage may be selected based on a desired voltage drop from the LBL node 408 to the read port node 204. In some embodiments, the bias voltage may be varied between ground and the supply voltage.

The source terminal of the second transistor 806 may be coupled to the LBL node 408 and the drain terminal of the second transistor 806 may be coupled to an intermediate LBL node 808, the intermediate LBL node 808 located between the first transistor 804 and the second transistor 806. The LBL node 408 may be representative of the LBL 114 (FIG. 1) and/or the LBL 116 (FIG. 1). The source terminal of the first transistor 804 may be coupled to the intermediate LBL node 808 and the drain terminal of the first transistor 804 may be coupled to the read port node 204.

The first transistor 804 may have a first threshold voltage and the second transistor 806 may have a second threshold voltage. The second transistor 806 may provide a second voltage drop from the LBL node 408 to the intermediate LBL node 808 equal to the second threshold voltage when the second transistor 806 is activated. The first transistor 804 may provide a first voltage drop from the intermediate LBL node 808 to the read port node 204 equal to the first threshold voltage when the first transistor 804 is activated. There may be a total voltage drop from the LBL node 408 to the read port node 204 equal to the first threshold voltage plus the second threshold voltage. The first transistor 804 and the second transistor 806 may be activated when a voltage of the LBL node 408 exceeds the total voltage drop, including when the LBL node 408 is set to a voltage corresponding to a logic high.

In some embodiments, the first voltage drop from the LBL node 408 to the intermediate LBL node 808 provided by the first transistor 804 may be between zero volts and the threshold voltage when the bias voltage applied to the gate of the first transistor 804 is between ground and the supply voltage. Further, the second voltage drop from the intermediate LBL node 808 to the read port node 204 provided by the second transistor 806 may be between zero volts and the threshold voltage when the bias voltage applied to the gate of the second transistor 806 is between ground and the supply voltage. There may be a total voltage drop from the LBL node 408 to the read port node 204 equal to the first voltage drop provided by the first transistor 804 plus second voltage drop provided by the second transistor 806. In this instance, the first transistor 804 and the second transistor 806 may be activated when the voltage of the LBL node 408 exceeds the total voltage drop.

The read port node 204 may be coupled to a bitcell array 200 (FIG. 2), as illustrated in FIG. 2. Due to the value of the read port node 204 being the total voltage drop below the LBL node 408 when the clipper circuitry 802 is activated, the voltage of the read port node 204 may be less than a voltage corresponding to a logic high when the LBL node 408 is set to a logic high. For example, the voltage of the read port node 204 may be equal to the voltage corresponding to the logic high minus the total voltage drop when the LBL node 408 is set to logic high.

Further, when the LBL node 408 is set to a logic low, the voltage of the LBL node 408 may drop below the total voltage drop, and the first transistor 804 and the second transistor 806 may be deactivated. When the first transistor 804 and the second transistor 806 are deactivated, the voltage of the read port node 204 may be equal to the voltage of the LBL node 408. For example, when the voltage of the LBL node 408 is set to zero volts, corresponding to a logic low, the voltage of the read port node 204 may be equal to zero volts.

Accordingly, during operation, the voltage of the read port node 204 may swing between a low value of zero volts and a high value of the voltage corresponding to a logic high minus the total voltage drop. In legacy single-ended sensing arrays, a read port node typically swings between zero volts and a voltage corresponding to the logic high. The decreased swing of the read port node 204 of the disclosed merge circuitry 800 may provide for energy savings. For example, less energy may be used to raise the voltage of the read port node 204 to the voltage corresponding to a logic high minus the total voltage drop than raising the read port node 204 to the voltage corresponding to the logic high. Further, less energy may be dissipated as the read port node 204 transitions from voltage corresponding to the logic high to zero volts. Additionally, utilizing the first transistor 804 and the second transistor 806 between the read port node 204 and the LBL 408 may lower the switching dynamic capacitance presented when switching between the logic high and the logic low.

Figure 9:
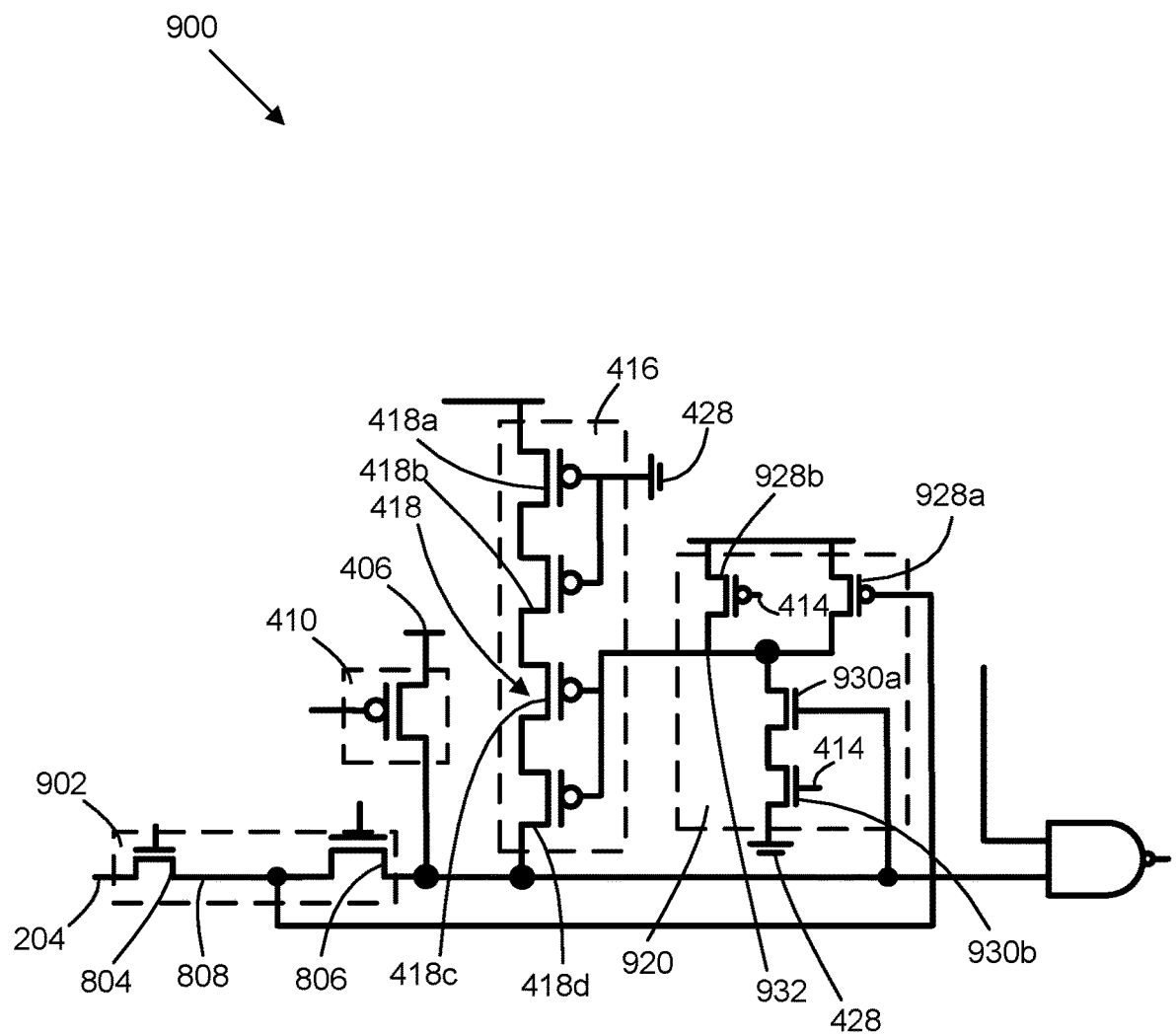
FIG. 9 illustrates a sixth example of read merge circuitry, according to various embodiments.

FIG. 9 illustrates a sixth example of read merge circuitry 900, according to various embodiments. The read merge circuitry 900 may include the features of the read merge circuitry 800 (FIG. 8) (including the clipper circuitry 802 (FIG. 8), the precharge circuitry 410 (FIG. 4), the keeper circuitry 416 (FIG. 4), the first NAND gate 420 (FIG. 4), the second NAND gate 424 (FIG. 4), or some combination thereof). The read merge circuitry 900 may be representative of the read merge circuitry 118 (FIG. 1), and clipper circuitry 902 may be representative of the clipper circuitry 110 (FIG. 1) and/or the clipper circuitry 112 (FIG. 1).

The read merge circuitry 900 may include clipper circuitry 902. The clipper circuitry 902 may include one or more of the features of the clipper circuitry 802 (FIG. 4), including the first transistor 804 and the second transistor 806 located between the read port node 204 and the LBL node 408. As with the clipper circuitry 802, the first transistor 804 may have a first threshold voltage and may provide a first voltage drop from the LBL node 408 to the intermediate LBL node 808 equal to the first threshold voltage when the first transistor 804 is activated. Further, the second transistor 806 may have a second threshold voltage and may provide a second voltage drop from the intermediate LBL node 808 to the read port node 204 equal to the second threshold voltage when the second transistor 806 is activated.

In some embodiments, the first voltage drop from the LBL node 408 to the intermediate LBL node 808 provided by the first transistor 804 may be between zero volts and the threshold voltage when the bias voltage applied to the gate of the first transistor 804 is between ground and the supply voltage. Further, the second voltage drop from the intermediate LBL node 808 to the read port node 204 provided by the second transistor 806 may be between zero volts and the threshold voltage when the bias voltage applied to the gate of the second transistor 806 is between ground and the supply voltage. There may be a total voltage drop from the LBL node 408 to the read port node 204 equal to the first voltage drop provided by the first transistor 804 plus the second voltage drop provided by the second transistor 806. In this instance, the first transistor 804 and the second transistor 806 may be activated when the voltage of the LBL node 408 exceeds the total voltage drop.

The read merge circuitry 900 may further include a first NAND gate 920. The first NAND gate 920 may include one or more of the features of the first NAND gate 420 (FIG. 4). The first NAND gate 920 may be coupled to the precharge node 414, the LBL node 408, the intermediate LBL node 808, or some combination thereof. In particular, the intermediate LBL node 808 may be coupled to transistor 928a within the first NAND gate 920, while transistor 928b may be coupled to the precharge node 414. Transistor 930a and transistor 930b may be coupled in series between an output node 932 of the first NAND gate 920 and ground 428 may have the transistor 930a coupled to the LBL node 408 and the transistor 930b coupled to the precharge node 414.

Coupling the intermediate LBL node 808 to the transistor 928a may cause the first NAND gate 920 to transition the output node 932 to a logic high earlier during discharge from a precharge phase (performed by precharge circuitry 410) than if the transistor 928a were coupled to the LBL node 408. In particular, due to the intermediate LBL node 808 being the second voltage drop lower than the LBL node 408, a voltage at the gate terminal of the transistor 928a may reach a transition voltage (where the transistor 928a transitions between activated and deactivated states) earlier during discharge than if the LBL node 408 was coupled to the gate terminal. In response to the voltage at the gate terminal of the transistor 928a dropping below the transition voltage, the transistor 928a may transition to an activated state.

In response to the transistor 928a transitioning to the activated state, the output node 932 of the first NAND gate 920 may transition to a logic high. The output node 932 may be coupled to a portion of the transistors 418 of the keeper circuitry 416. One or more of the transistors 418 adjacent to the coupling to the supply rail 406 may have gate terminals coupled to ground 428, whereas the other transistors 418 may have gate terminals coupled to output node 932 of the first NAND gate 920. In the illustrated embodiment, the transistor 418a and the transistor 418b adjacent to the coupling to the supply rail 406 may have gate terminals coupled to ground 428 and the transistor 418c and the transistor 418d may have gate terminals coupled to output node 932.

Due to the output node 932 transitioning to the logic high earlier than if the gate terminal of the transistor 928a was coupled to the LBL node 408, the transistor 418c and the transistor 418d may transition to a deactivated state earlier. The transistor 418c and the transistor 418d transitioning to the deactivated state may cause the transistor 418a and the transistor 418b to transition to the deactivated state. During the activated state, the transistors 418 may experience voltage stress across the gate oxide of the transistors 418, which may degrade the transistors 418 (referred to as 'aging' of the transistors 418) and reduce the ability of the transistors 418 to withstand noise events. Due to the transistors 418 transitioning to the deactivated state earlier, the voltage stress the transistors 418 experience may be decreased and the degradation of the transistors 418 may be decreased.

Figure 10:
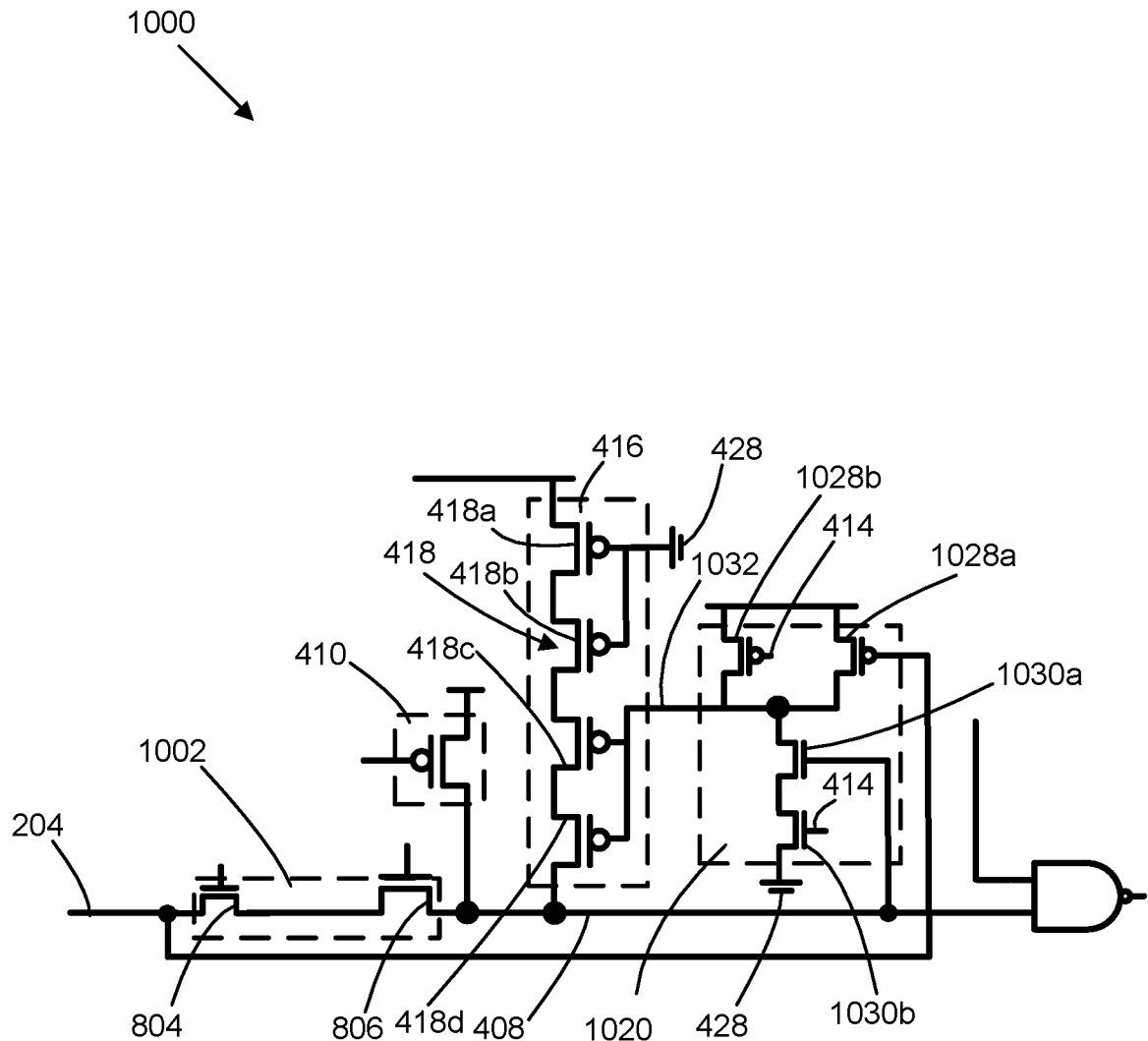
FIG. 10 illustrates a seventh example of read merge circuitry, according to various embodiments.

FIG. 10 illustrates a seventh example of read merge circuitry 1000, according to various embodiments. The read merge circuitry 1000 may include the features of the read merge circuitry 800 (FIG. 8) (including the clipper circuitry 802 (FIG. 8), the precharge circuitry 410 (FIG. 4), the keeper circuitry 416 (FIG. 4), the first NAND gate 420 (FIG. 4), the second NAND gate 424 (FIG. 4), or some combination thereof). The read merge circuitry 1000 may be representative of the read merge circuitry 118 (FIG. 1), and clipper circuitry 1002 may be representative of the clipper circuitry 110 (FIG. 1) and/or the clipper circuitry 112 (FIG. 1).

The read merge circuitry 1000 may include clipper circuitry 1002. The clipper circuitry 1002 may include one or more of the features of the clipper circuitry 802 (FIG. 4), including the first transistor 804 and the second transistor 806 located between the read port node 204 and the LBL node 408. As with the clipper circuitry 802, the first transistor 804 may have a first threshold voltage and may provide a first voltage drop from the LBL node 408 to the intermediate LBL node 808 equal to the first threshold voltage when the first transistor 804 is activated. Further, the second transistor 806 may have a second threshold voltage and may provide a second voltage drop from the intermediate LBL node 808 to the read port node 204 equal to the second threshold voltage when the second transistor 806 is activated. A total voltage drop from the LBL node 408 to the read port node 204 may be equal to the first threshold voltage plus the second threshold voltage.

In some embodiments, the first voltage drop from the LBL node 408 to the intermediate LBL node 808 provided by the first transistor 804 may be between zero volts and the threshold voltage when the bias voltage applied to the gate of the first transistor 804 is between ground and the supply voltage. Further, the second voltage drop from the intermediate LBL node 808 to the read port node 204 provided by the second transistor 806 may be between zero volts and the threshold voltage when the bias voltage applied to the gate of the second transistor 806 is between ground and the supply voltage. There may be a total voltage drop from the LBL node 408 to the read port node 204 equal to the first voltage drop provided by the first transistor 804 plus the second voltage drop provided by the second transistor 806. In this instance, the first transistor 804 and the second transistor 806 may be activated when the voltage of the LBL node 408 exceeds the total voltage drop.

The read merge circuitry 1000 may further include a first NAND gate 1020. The first NAND gate 1020 may include one or more of the features of the first NAND gate 420 (FIG. 4). The first NAND gate 1020 may be coupled to the precharge node 414, the LBL node 408, the read port node 204, or some combination thereof. In particular, the read port node 204 may be coupled to transistor 1028a within the first NAND gate 1020, while transistor 1028b may be coupled to the precharge node 414. Transistor 1030a and transistor 1030b may be coupled in series between an output node 1032 of the first NAND gate 1020 and ground 428. The transistor 1030a may be coupled to the LBL node 408 and the transistor 1030b may be coupled to the precharge node 414.

Coupling the read port node 204 to the transistor 1028a may cause the first NAND gate 1020 to transition the output node 1032 to a logic high earlier during discharge from a precharge phase (performed by precharge circuitry 410) than if the transistor 1028a were coupled to the LBL node 408. In particular, due to the read port node 204 being the second voltage drop lower than the LBL node 408, a voltage at the gate terminal of the transistor 1028a may reach a transition voltage (where the transistor 1028a transitions between activated and deactivated states) earlier during discharge than if the LBL node 408 was coupled to the gate terminal. In response to the voltage at the gate terminal of the transistor 1028a dropping below the transition voltage, the transistor 1028a may transition to an activated state.

In response to the transistor 1028a transitioning to the activated state, the output node 1032 of the first NAND gate 1020 may transition to a logic high. The output node 1032 may be coupled to a portion of the transistors 418 of the keeper circuitry 416. One or more of the transistors 418 adjacent to the coupling to the supply rail 406 may have gate terminals coupled to ground 428, whereas the other transistors 418 may have gate terminals coupled to output node 1032 of the first NAND gate 1020. In the illustrated embodiment, the transistor 418a and the transistor 418b adjacent to the coupling to the supply rail 406 may have gate terminals coupled to ground 428 and the transistor 418c and the transistor 418d may have gate terminals coupled to output node 1032.

Due to the output node 1032 transitioning to the logic high earlier than if the gate terminal of the transistor 1028a was coupled to the LBL node 408, the transistor 418c and the transistor 418d may transition to a deactivated state earlier. The transistor 418c and the transistor 418d transitioning to the deactivated state may cause the transistor 418a and the transistor 418b to transition to the deactivated state. During the activated state, the transistors 418 may experience voltage stress across the gate oxide of the transistors 418, which may degrade the transistors 418 (referred to as 'aging' of the transistors 418) and reduce the ability of the transistors 418 to withstand noise events. Due to the transistors 418 transitioning to the deactivated state earlier, the voltage stress the transistors 418 experience may be decreased and the degradation of the transistors 418 may be decreased.

Figure 11:
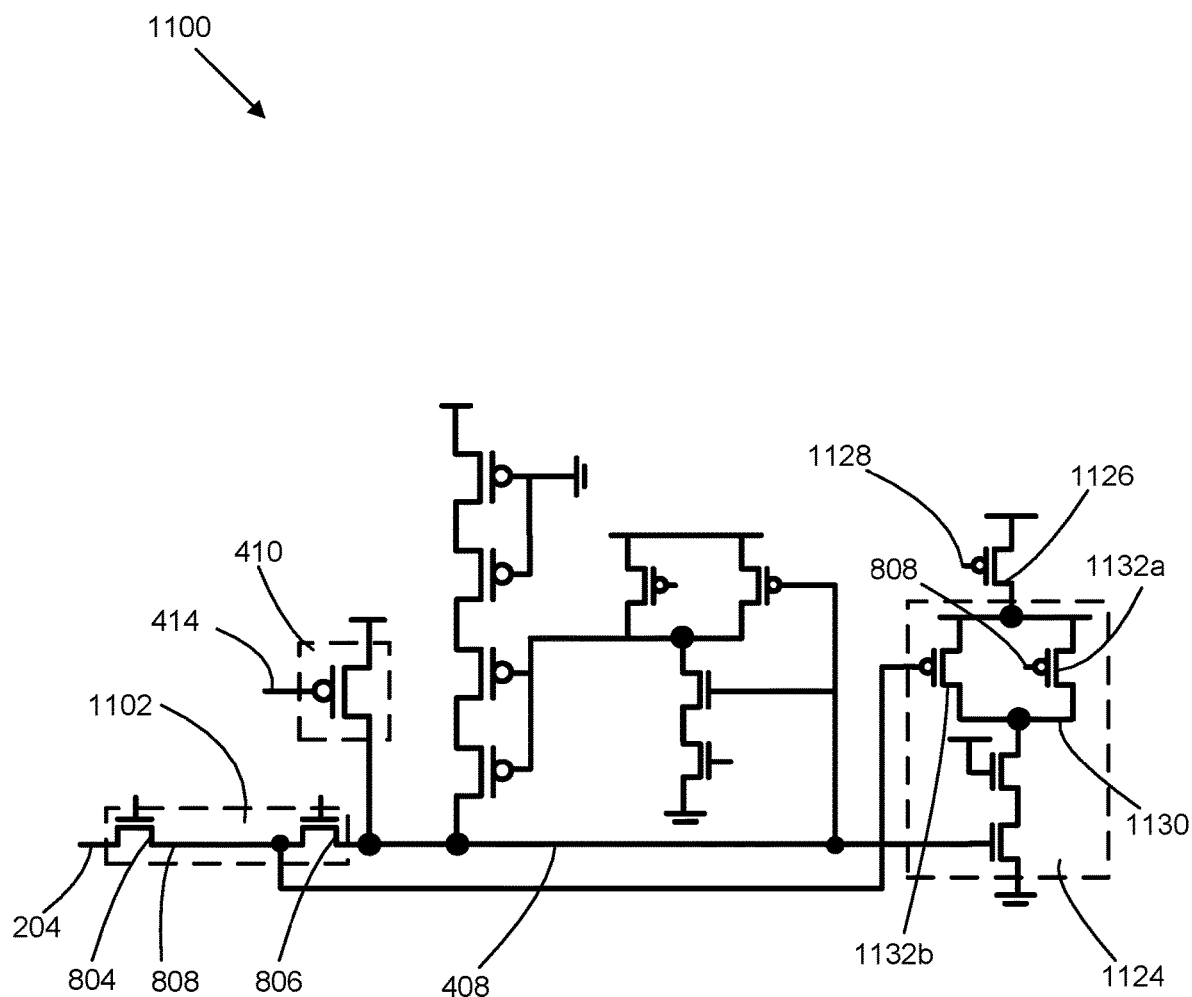
FIG. 11 illustrates an eighth example of read merge circuitry, according to various embodiments.

FIG. 11 illustrates an eighth example of read merge circuitry 1100, according to various embodiments. The read merge circuitry 1100 may include the features of the read merge circuitry 800 (FIG. 8) (including the clipper circuitry 802 (FIG. 8), the precharge circuitry 410 (FIG. 4), the keeper circuitry 416 (FIG. 4), the first NAND gate 420 (FIG. 4), the second NAND gate 424 (FIG. 4), or some combination thereof). The read merge circuitry 1100 may be representative of the read merge circuitry 118 (FIG. 1), and clipper circuitry 1102 may be representative of the clipper circuitry 110 (FIG. 1) and/or the clipper circuitry 112 (FIG. 1).

The read merge circuitry 1100 may include clipper circuitry 1102. The clipper circuitry 1102 may include one or more of the features of the clipper circuitry 802 (FIG. 4), including the first transistor 804 and the second transistor 806 located between the read port node 204 and the LBL node 408. As with the clipper circuitry 802, the first transistor 804 may have a first threshold voltage and may provide a first voltage drop from the LBL node 408 to the intermediate LBL node 808 equal to the first threshold voltage when the first transistor 804 is activated. Further, the second transistor 806 may have a second threshold voltage and may provide a second voltage drop from the intermediate LBL node 808 to the read port node 204 equal to the second threshold voltage when the second transistor 806 is activated. A total voltage drop from the LBL node 408 to the read port node 204 may be equal to the first threshold voltage plus the second threshold voltage.

In some embodiments, the first voltage drop from the LBL node 408 to the intermediate LBL node 808 provided by the first transistor 804 may be between zero volts and the threshold voltage when the bias voltage applied to the gate of the first transistor 804 is between ground and the supply voltage. Further, the second voltage drop from the intermediate LBL node 808 to the read port node 204 provided by the second transistor 806 may be between zero volts and the threshold voltage when the bias voltage applied to the gate of the second transistor 806 is between ground and the supply voltage. There may be a total voltage drop from the LBL node 408 to the read port node 204 equal to the first voltage drop provided by the first transistor 804 plus the second voltage drop provided by the second transistor 806. In this instance, the first transistor 804 and the second transistor 806 may be activated when the voltage of the LBL node 408 exceeds the total voltage drop.

The read merge circuitry 1100 may include second NAND gate 1124. The second NAND gate 1124 may include one or more of the features of the second NAND gate 424 (FIG. 4). The second NAND gate 1124 may be coupled to the LBL node 408, the second LBL node 426, the intermediate LBL node 808, or some combination thereof. The second NAND gate 1124 may be further coupled to a header transistor 1126 coupled to an inverted precharge node 1128 (which has a value equal to the logical inverse of the precharge node 414), wherein the header transistor 1126 may cause a GBL node 1130 to be a logic low when the header transistor 1126 is deactivated. The header transistor 1126 may prevent the second NAND gate 1124 from short-circuiting during a precharge phase (performed by precharge circuitry 410).

The intermediate LBL node 808 may be coupled to gate terminals of both of transistor 1132a and transistor 1132b. Coupling the intermediate LBL node 808 to the transistor 1132a and the transistor 1132b may cause the second NAND gate 1124 to transition the GBL 1130 to a logic high earlier during discharge from a precharge phase than if the transistor 1132a and the transistor 1132b were coupled to the LBL node 408. In particular, due to the intermediate LBL node 808 being a second voltage drop lower than the LBL node 408, a voltage at the gate terminal of the transistor 1132a and the transistor 1132b may reach a transition voltage (where the transistor 1132a and the transistor 1132b transition between activated and deactivated states) earlier during discharge than if the LBL node 408 was coupled to the gate terminals. In response to the voltage at the gate terminals of the transistor 1132a and the transistor 1132b dropping below the transition voltage, the transistor 1132a and the transistor 1132b may transition to an activated state.

In response to the transistor 1132a and the transistor 1132b transitioning to the activated state, the GBL node 1130 of the second NAND gate 1124 may transition to a logic high. Based on the GBL node 1130 transitioning to a logic high earlier, a speed at which the GBL node 1130 is evaluated may be increased. The GBL node 1130 may be evaluated by a SDL (such as the SDL 300 (FIG. 3)) coupled to the GBL node 1130.

Figure 12:
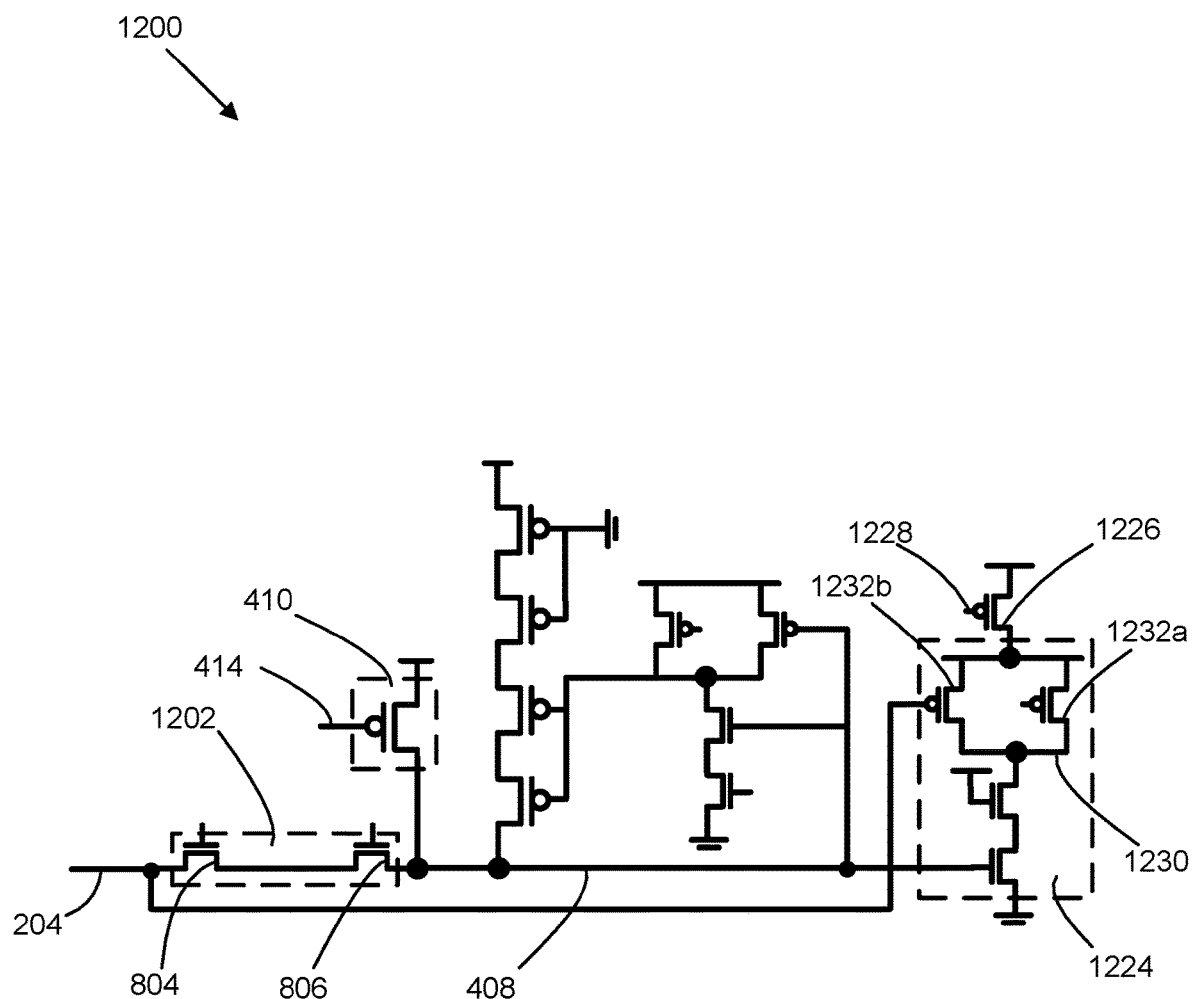
FIG. 12 illustrates a ninth example of read merge circuitry, according to various embodiments.

FIG. 12 illustrates a ninth example of read merge circuitry 1200, according to various embodiments. The read merge circuitry 1200 may include the features of the read merge circuitry 800 (FIG. 8) (including the clipper circuitry 802 (FIG. 8), the precharge circuitry 410 (FIG. 4), the keeper circuitry 416 (FIG. 4), the first NAND gate 420 (FIG. 4), the second NAND gate 424 (FIG. 4), or some combination thereof). The read merge circuitry 1200 may be representative of the read merge circuitry 118 (FIG. 1), and clipper circuitry 1202 may be representative of the clipper circuitry 110 (FIG. 1) and/or the clipper circuitry 112 (FIG. 1).

The read merge circuitry 1200 may include clipper circuitry 1202. The clipper circuitry 1202 may include one or more of the features of the clipper circuitry 802 (FIG. 4), including the first transistor 804 and the second transistor 806 located between the read port node 204 and the LBL node 408. As with the clipper circuitry 802, the first transistor 804 may have a first threshold voltage and may provide a first voltage drop from the LBL node 408 to the intermediate LBL node 808 equal to the first threshold voltage when the first transistor 804 is activated. Further, the second transistor 806 may have a second threshold voltage and may provide a second voltage drop from the intermediate LBL node 808 to the read port node 204 equal to the second threshold voltage when the second transistor 806 is activated. A total voltage drop from the LBL node 408 to the read port node 204 may be equal to the first threshold voltage plus the second threshold voltage.

In some embodiments, the first voltage drop from the LBL node 408 to the intermediate LBL node 808 provided by the first transistor 804 may be between zero volts and the threshold voltage when the bias voltage applied to the gate of the first transistor 804 is between ground and the supply voltage. Further, the second voltage drop from the intermediate LBL node 808 to the read port node 204 provided by the second transistor 806 may be between zero volts and the threshold voltage when the bias voltage applied to the gate of the second transistor 806 is between ground and the supply voltage. There may be a total voltage drop from the LBL node 408 to the read port node 204 equal to the first voltage drop provided by the first transistor 804 plus the second voltage drop provided by the second transistor 806. In this instance, the first transistor 804 and the second transistor 806 may be activated when the voltage of the LBL node 408 exceeds the total voltage drop.

The read merge circuitry 1200 may include second NAND gate 1224. The second NAND gate 1224 may include one or more of the features of the second NAND gate 424 (FIG. 4). The second NAND gate 1224 may be coupled to the LBL node 408, the second LBL node 426, the read port node 204, or some combination thereof. The second NAND gate 1224 may be further coupled to a header transistor 1226 coupled to an inverted precharge node 1228 (which has a value equal to the logical inverse of the precharge node 414), wherein the header transistor 1226 may cause a GBL node 1230 to be a logic low when the header transistor 1226 is deactivated. The header transistor 1226 may prevent the second NAND gate 1224 from short-circuiting during a precharge phase (performed by precharge circuitry 410).

The read port node 204 may be coupled to gate terminals of both of transistor 1232a and the transistor 1232b. Coupling the read port node 204 to the transistor 1232a and the transistor 1232b may cause the second NAND gate 1224 to transition the GBL 1230 to a logic high earlier during discharge from a precharge phase than if the transistor 1232a and the transistor 1232b were coupled to the LBL node 408. In particular, due to the read port node 204 being the total voltage drop lower than the LBL node 408, a voltage at the gate terminal of the transistor 1232a and the transistor 1232b may reach a transition voltage (where the transistor 1232a and the transistor 1232b transition between activated and deactivated states) earlier during discharge than if the LBL node 408 was coupled to the gate terminals. In response to the voltage at the gate terminals of the transistor 1232a and the transistor 1232b dropping below the transition voltage, the transistor 1232a and the transistor 1232b may transition to an activated state.

In response to the transistor 1232a and the transistor 1232b transitioning to the activated state, the GBL node 1230 of the second NAND gate 1224 may transition to a logic high. Based on the GBL node 1230 transitioning to a logic high earlier, a speed at which the GBL node 1230 is evaluated may be increased. The GBL node 1230 may be evaluated by a SDL (such as the SDL 300 (FIG. 3)) coupled to the GBL node 1230.

Figure 13:
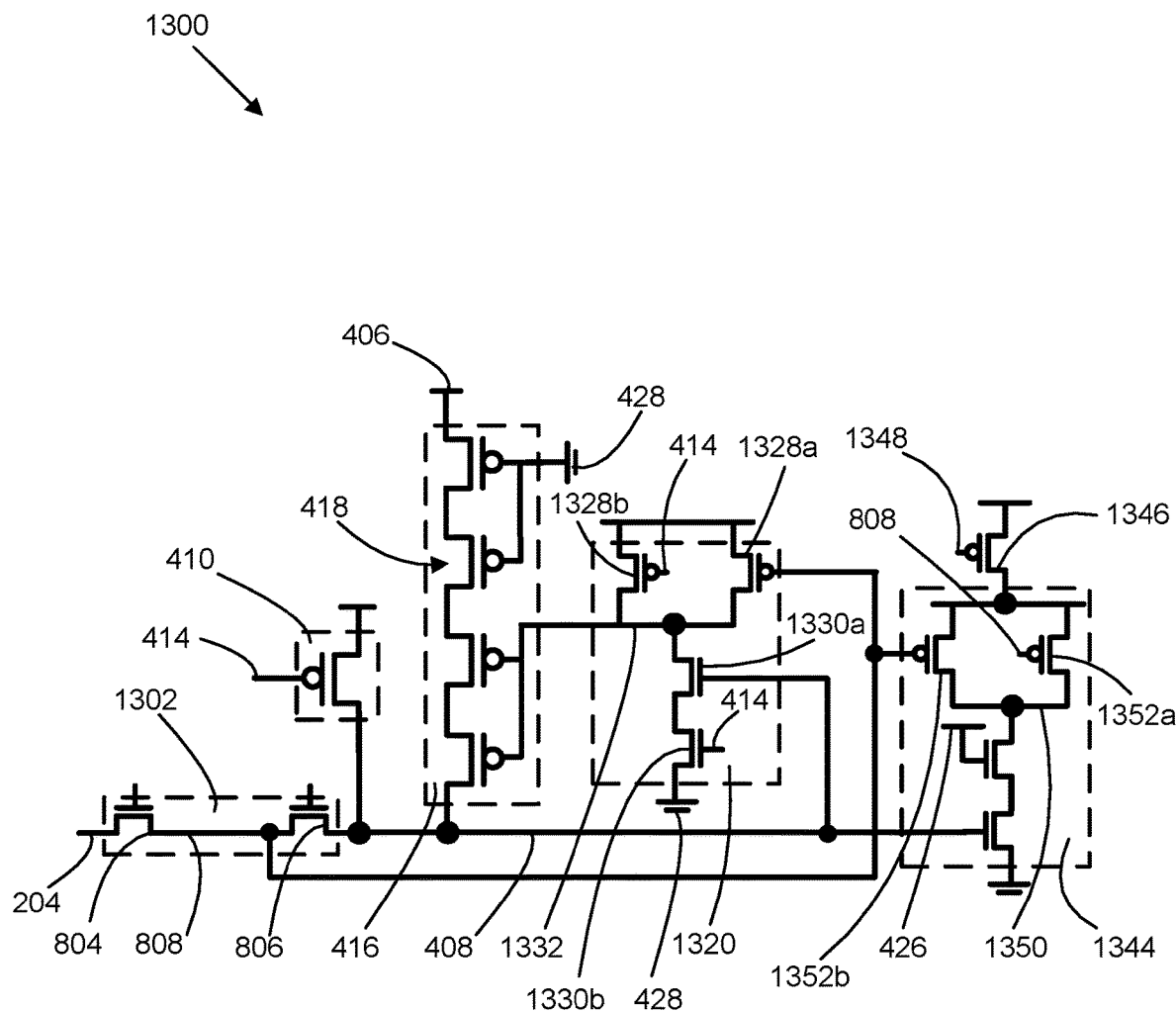
FIG. 13 illustrates a tenth example of read merge circuitry, according to various embodiments.

FIG. 13 illustrates a tenth example of read merge circuitry 1300, according to various embodiments. The read merge circuitry 1300 may include the features of the read merge circuitry 800 (FIG. 8) (including the clipper circuitry 802 (FIG. 8), the precharge circuitry 410 (FIG. 4), the keeper circuitry 416 (FIG. 4), the first NAND gate 420 (FIG. 4), the second NAND gate 424 (FIG. 4), or some combination thereof). The read merge circuitry 1300 may be representative of the read merge circuitry 118 (FIG. 1), and clipper circuitry 1302 may be representative of the clipper circuitry 110 (FIG. 1) and/or the clipper circuitry 112 (FIG. 1).

The read merge circuitry 1300 may include clipper circuitry 1302. The clipper circuitry 1302 may include one or more of the features of the clipper circuitry 802 (FIG. 4), including the first transistor 804 and the second transistor 806 located between the read port node 204 and the LBL node 408. As with the clipper circuitry 802, the first transistor 804 may have a first threshold voltage and may provide a first voltage drop from the LBL node 408 to the intermediate LBL node 808 equal to the first threshold voltage when the first transistor 804 is activated. Further, the second transistor 806 may have a second threshold voltage and may provide a second voltage drop from the intermediate LBL node 808 to the read port node 204 equal to the second threshold voltage when the second transistor 806 is activated. A total voltage drop from the LBL node 408 to the read port node 204 may be equal to the first threshold voltage plus the second threshold voltage.

In some embodiments, the first voltage drop from the LBL node 408 to the intermediate LBL node 808 provided by the first transistor 804 may be between zero volts and the threshold voltage when the bias voltage applied to the gate of the first transistor 804 is between ground and the supply voltage. Further, the second voltage drop from the intermediate LBL node 808 to the read port node 204 provided by the second transistor 806 may be between zero volts and the threshold voltage when the bias voltage applied to the gate of the second transistor 806 is between ground and the supply voltage. There may be a total voltage drop from the LBL node 408 to the read port node 204 equal to the first voltage drop provided by the first transistor 804 plus the second voltage drop provided by the second transistor 806. In this instance, the first transistor 804 and the second transistor 806 may be activated when the voltage of the LBL node 408 exceeds the total voltage drop.

The read merge circuitry 1300 may further include a first NAND gate 1320. The first NAND gate 1320 may include one or more of the features of the first NAND gate 420 (FIG. 4). The first NAND gate 1320 may be coupled to the precharge node 414, the LBL node 408, the intermediate LBL node 808, or some combination thereof. In particular, the intermediate LBL node 808 may be coupled to transistor 1328a within the first NAND gate 1320, while the transistor 1328b may be coupled to the precharge node 414. Transistor 1330a and transistor 1330b may be coupled in series between an output node 1332 of the first NAND gate 1320 and ground 428 may have the transistor 1330a coupled to the LBL node 408 and the transistor 1330b coupled to the precharge node 414.

Coupling the intermediate LBL node 808 to the transistor 1328a may cause the first NAND gate 1320 to transition the output node 1332 to a logic high earlier during discharge from a precharge phase (performed by precharge circuitry 410) than if the transistor 1328a were coupled to the LBL node 408. In particular, due to the intermediate LBL node 808 being the second voltage drop lower than the LBL node 408, a voltage at the gate terminal of the transistor 1328a may reach a transition voltage (where the transistor 1328a transitions between activated and deactivated states) earlier during discharge than if the LBL node 408 was coupled to the gate terminal. In response to the voltage at the gate terminal of the transistor 1328a dropping below the transition voltage, the transistor 1328a may transition to an activated state.

In response to the transistor 1328a transitioning to the activated state, the output node 1332 of the first NAND gate 1320 may transition to a logic high. The output node 1332 may be coupled to a portion of the transistors 418 of the keeper circuitry 416. One or more of the transistors 418 adjacent to the coupling to the supply rail 406 may have gate terminals coupled to ground 428, whereas the other transistors 418 may have gate terminals coupled to output node 1332 of the first NAND gate 1320. In the illustrated embodiment, the transistor 418a and the transistor 418b adjacent to the coupling to the supply rail 406 may have gate terminals coupled to ground 428 and the transistor 418c and the transistor 418d may have gate terminals coupled to output node 1332.

Due to the output node 1332 transitioning to the logic high earlier than if the gate terminal of the transistor 1328a was coupled to the LBL node 408, the transistor 418c and the transistor 418d may transition to a deactivated state earlier. The transistor 418c and the transistor 418d transitioning to the deactivated state may cause the transistor 418a and the transistor 418b to transition to the deactivated state. During the activated state, the transistors 418 may experience voltage stress across the gate oxide of the transistors 418, which may degrade the transistors 418 (referred to as 'aging' of the transistors 418) and reduce the ability of the transistors 418 to withstand noise events. Due to the transistors 418 transitioning to the deactivated state earlier, the voltage stress the transistors 418 experience may be decreased and the degradation of the transistors 418 may be decreased.

The read merge circuitry 1300 may include second NAND gate 1344. The second NAND gate 1344 may include one or more of the features of the second NAND gate 424 (FIG. 4). The second NAND gate 1344 may be coupled to the LBL node 408, the second LBL node 426, the intermediate LBL node 808, or some combination thereof. The second NAND gate 1344 may be further coupled to a header transistor 1346 coupled to an inverted precharge node 1348 (which has a value equal to the logical inverse of the precharge node 414), wherein the header transistor 1346 may cause a GBL node 1350 to be a logic low when the header transistor 1346 is deactivated. The header transistor 1346 may prevent the second NAND gate 1344 from short-circuiting during a precharge phase (performed by precharge circuitry 410).

The intermediate LBL node 808 may be coupled to gate terminals of transistor 1352a and transistor 1352b. Coupling the intermediate LBL node 808 to the transistor 1352a and the transistor 1352b may cause the second NAND gate 1344 to transition the GBL 1350 to a logic high earlier during discharge from a precharge phase than if the transistor 1352a and the transistor 1352b were coupled to the LBL node 408. In particular, due to the intermediate LBL node 808 being a second voltage drop lower than the LBL node 408, a voltage at the gate terminal of the transistor 1352a and the transistor 1352b may reach a transition voltage (where the transistor 1352a and the transistor 1352b transition between activated and deactivated states) earlier during discharge than if the LBL node 408 was coupled to the gate terminals. In response to the voltage at the gate terminals of the transistor 1352a and the transistor 1352b dropping below the transition voltage, the transistor 1352a and the transistor 1352b may transition to an activated state.

In response to the transistor 1352a and the transistor 1352b transitioning to the activated state, the GBL node 1350 of the second NAND gate 1344 may transition to a logic high. Based on the GBL node 1350 transitioning to a logic high earlier, a speed at which the GBL node 1350 is evaluated may be increased. The GBL node 1350 may be evaluated by a SDL (such as the SDL 300 (FIG. 3)) coupled to the GBL node 1350.

Figure 14:
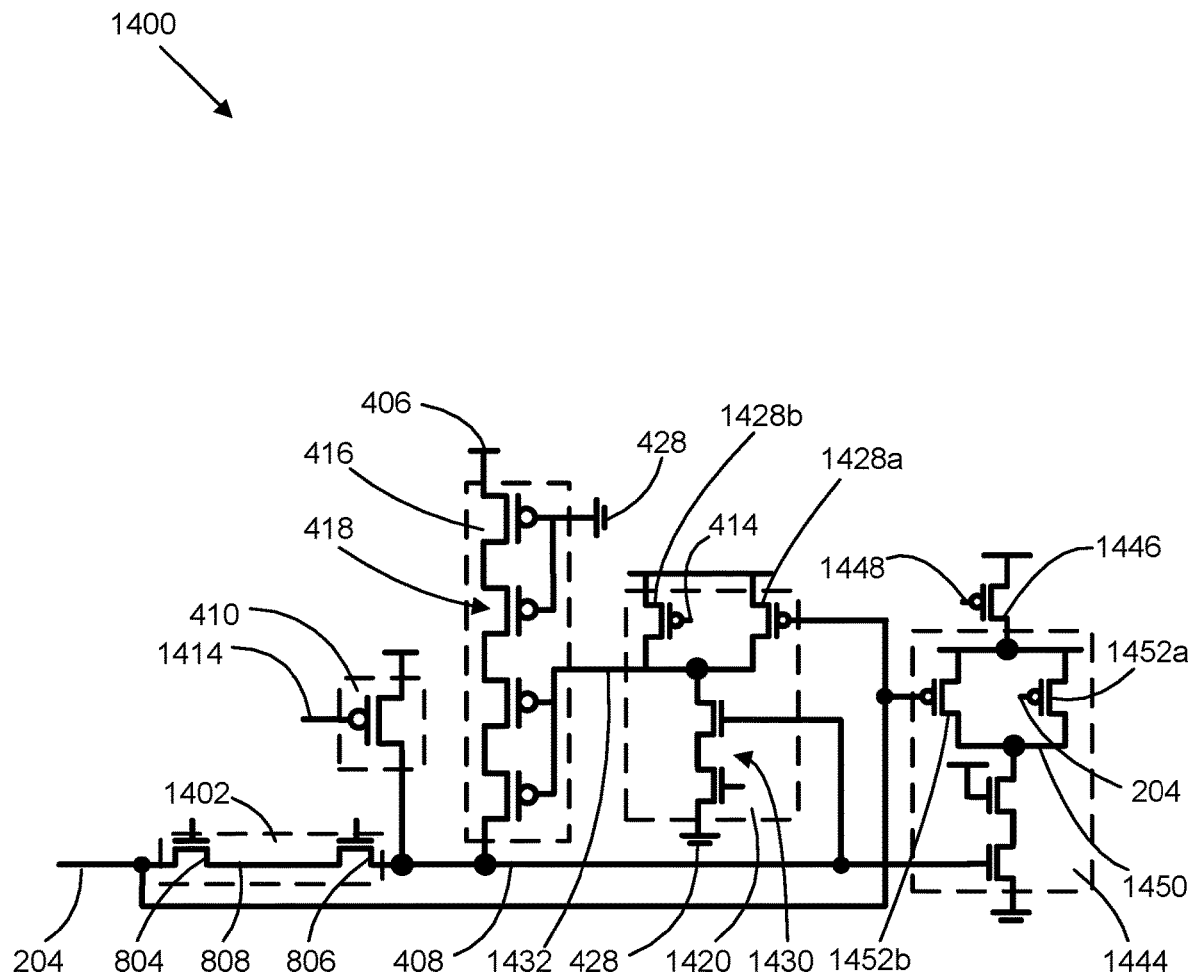
FIG. 14 illustrates an eleventh example of read merge circuitry, according to various embodiments.

FIG. 14 illustrates an eleventh example of read merge circuitry 1400, according to various embodiments. The read merge circuitry 1400 may include the features of the read merge circuitry 800 (FIG. 8) (including the clipper circuitry 802 (FIG. 8), the precharge circuitry 410 (FIG. 4), the keeper circuitry 416 (FIG. 4), the first NAND gate 420 (FIG. 4), the second NAND gate 424 (FIG. 4), or some combination thereof). The read merge circuitry 1400 may be representative of the read merge circuitry 118 (FIG. 1), and clipper circuitry 1402 may be representative of the clipper circuitry 110 (FIG. 1) and/or the clipper circuitry 112 (FIG. 1).

The read merge circuitry 1400 may include clipper circuitry 1402. The clipper circuitry 1402 may include one or more of the features of the clipper circuitry 802 (FIG. 4), including the first transistor 804 and the second transistor 806 located between the read port node 204 and the LBL node 408. As with the clipper circuitry 802, the first transistor 804 may have a first threshold voltage and may provide a first voltage drop from the LBL node 408 to the intermediate LBL node 808 equal to the first threshold voltage when the first transistor 804 is activated. Further, the second transistor 806 may have a second threshold voltage and may provide a second voltage drop from the intermediate LBL node 808 to the read port node 204 equal to the second threshold voltage when the second transistor 806 is activated. A total voltage drop from the LBL node 408 to the read port node 204 may be equal to the first threshold voltage plus the second threshold voltage.

In some embodiments, the first voltage drop from the LBL node 408 to the intermediate LBL node 808 provided by the first transistor 804 may be between zero volts and the threshold voltage when the bias voltage applied to the gate of the first transistor 804 is between ground and the supply voltage. Further, the second voltage drop from the intermediate LBL node 808 to the read port node 204 provided by the second transistor 806 may be between zero volts and the threshold voltage when the bias voltage applied to the gate of the second transistor 806 is between ground and the supply voltage. There may be a total voltage drop from the LBL node 408 to the read port node 204 equal to the first voltage drop provided by the first transistor 804 plus the second voltage drop provided by the second transistor 806. In this instance, the first transistor 804 and the second transistor 806 may be activated when the voltage of the LBL node 408 exceeds the total voltage drop.

The read merge circuitry 1400 may further include a first NAND gate 1420. The first NAND gate 1420 may include one or more of the features of the first NAND gate 420 (FIG. 4). The first NAND gate 1420 may be coupled to the precharge node 414, the LBL node 408, the read port node 204, or some combination thereof. In particular, the read port node 204 may be coupled to transistor 1428a within the first NAND gate 1420, while the transistor 1428b may be coupled to the precharge node 414. Transistor 1430a and transistor 1430b may be coupled in series between an output node 1432 of the first NAND gate 1420 and ground 428. The transistor 1430a may be coupled to the LBL node 408 and the transistor 1430b coupled to the precharge node 414.

Coupling the read port node 204 to the transistor 1428a may cause the first NAND gate 1420 to transition the output node 1432 to a logic high earlier during discharge from a precharge phase (performed by precharge circuitry 410) than if the transistor 1428a were coupled to the LBL node 408. In particular, due to the read port node 204 being the second voltage drop lower than the LBL node 408, a voltage at the gate terminal of the transistor 1428a may reach a transition voltage (where the transistor 1428a transitions between activated and deactivated states) earlier during discharge than if the LBL node 408 was coupled to the gate terminal. In response to the voltage at the gate terminal of the transistor 1428a dropping below the transition voltage, the transistor 1428a may transition to an activated state.

In response to the transistor 1428a transitioning to the activated state, the output node 1432 of the first NAND gate 1420 may transition to a logic high. The output node 1432 may be coupled to a portion of the transistors 418 of the keeper circuitry 416. One or more of the transistors 418 adjacent to the coupling to the supply rail 406 may have gate terminals coupled to ground 428, whereas the other transistors 418 may have gate terminals coupled to output node 1432 of the first NAND gate 1420. In the illustrated embodiment, the transistor 418a and the transistor 418b adjacent to the coupling to the supply rail 406 may have gate terminals coupled to ground 428 and the transistor 418c and the transistor 418d may have gate terminals coupled to output node 1432.

Due to the output node 1432 transitioning to the logic high earlier than if the gate terminal of the transistor 1428a was coupled to the LBL node 408, the transistor 418c and the transistor 418d may transition to a deactivated state earlier. The transistor 418c and the transistor 418d transitioning to the deactivated state may cause the transistor 418a and the transistor 418b to transition to the deactivated state. During the activated state, the transistors 418 may experience voltage stress across the gate oxide of the transistors 418, which may degrade the transistors 418 (referred to as 'aging' of the transistors 418) and reduce the ability of the transistors 418 to withstand noise events. Due to the transistors 418 transitioning to the deactivated state earlier, the voltage stress the transistors 418 experience may be decreased and the degradation of the transistors 418 may be decreased.

The read merge circuitry 1400 may include second NAND gate 1444. The second NAND gate 1444 may include one or more of the features of the second NAND gate 424 (FIG. 4). The second NAND gate 1444 may be coupled to the LBL node 408, the second LBL node 426, the read port node 204, or some combination thereof. The second NAND gate 1444 may be further coupled to a header transistor 1446 coupled to an inverted precharge node 1448 (which has a value equal to the logical inverse of the precharge node 1414), wherein the header transistor 1446 may cause a GBL node 1450 to be a logic low when the header transistor 1446 is deactivated. The header transistor 1446 may prevent the second NAND gate 1444 from short-circuiting during a precharge phase (performed by precharge circuitry 410).

The read port node 204 may be coupled to gate terminals of both of transistor 1452a and transistor 1452b. Coupling the read port node 204 to the transistor 1452a and the transistor 1452b may cause the second NAND gate 1444 to transition the GBL 1450 to a logic high earlier during discharge from a precharge phase than if the transistor 1452a and the transistor 1452b were coupled to the LBL node 408. In particular, due to the read port node 204 being the total voltage drop lower than the LBL node 408, a voltage at the gate terminal of the transistor 1452a and the transistor 1452b may reach a transition voltage (where the transistor 1452a and the transistor 1452b transition between activated and deactivated states) sooner during discharge than if the LBL node 408 was coupled to the gate terminals. In response to the voltage at the gate terminals of the transistor 1452a and the transistor 1452b dropping below the transition voltage, the transistor 1452a and the transistor 1452b may transition to an activated state.

In response to the transistor 1452a and the transistor 1452b transitioning to the activated state, the GBL node 1450 of the second NAND gate 1444 may transition to a logic high. Based on the GBL node 1450 transitioning to a logic high sooner, a speed at which the GBL node 1450 is evaluated may be increased. The GBL node 1450 may be evaluated by a SDL (such as the SDL 300 (FIG. 3)) coupled to the GBL node 1450.

Figure 15:
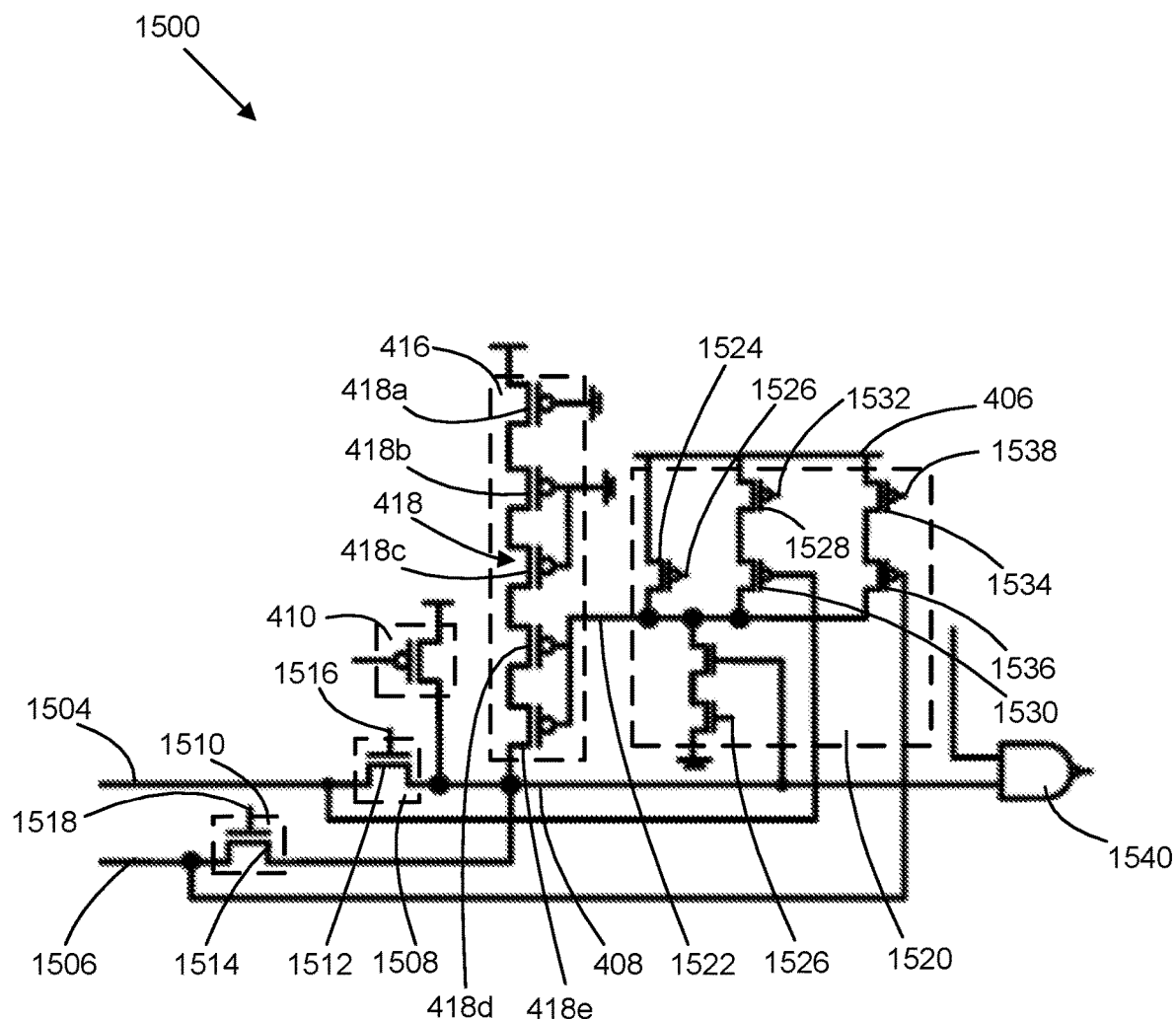
FIG. 15 illustrates a first example of multiplexing read merge circuitry, according to various embodiments.

FIG. 15 illustrates an example of multiplexing read merge circuitry 1500, according to various embodiments. The multiplexing read merge circuitry 1500 may include one or more of the features of the read merge circuitry 118 (FIG. 1), the read merge circuitry 400 (FIG. 4), the read merge circuitry 500 (FIG. 5), the read merge circuitry 600 (FIG. 6), the read merge circuitry 700 (FIG. 7), the read merge circuitry 800 (FIG. 8), the read merge circuitry 900 (FIG. 9), the read merge circuitry 1000 (FIG. 10), the read merge circuitry 1100 (FIG. 11), the read merge circuitry 1200 (FIG. 12), the read merge circuitry 1300 (FIG. 13), the read merge circuitry 1400 (FIG. 14), or some combination thereof.

The multiplexing read merge circuitry 1500 may be coupled to multiple bitcell arrays (such as the bitcell array 200 (FIG. 2)) via multiple read port nodes. The illustrated embodiment includes a first read port node 1504 and a second read port node 1506. The first read port node 1504 may be coupled to a read port node (such as the read port node 204 (FIG. 2)) of a first bitcell array and the second read port node 1506 may be coupled to a read port node (such as the read port node 206 (FIG. 2)) of a second bitcell array. It is to be understood that in other embodiments, there may be more than two read port nodes, wherein each of the read port nodes may correspond to a separate bitcell array.

The multiplexing read merge circuitry 1502 may include first clipper circuitry 1508 and second clipper circuitry 1510. The clipper circuitry 1508 and the second clipper circuitry 1510 may include one or more of the features of the clipper circuitry 110 (FIG. 1), the clipper circuitry 402 (FIG. 4), the clipper circuitry 502 (FIG. 5), the clipper circuitry 602 (FIG. 6), the clipper circuitry 702 (FIG. 7), the clipper circuitry 802 (FIG. 8), the clipper circuitry 902 (FIG. 9), the clipper circuitry 1002 (FIG. 10), the clipper circuitry 1102 (FIG. 11), the clipper circuitry 1202 (FIG. 12), the clipper circuitry 1302 (FIG. 13), the clipper circuitry (FIG. 14), or some combination thereof.

The first clipper circuitry 1508 may be coupled to the first read port node 1504 and the second clipper circuitry 1510 may be coupled to the second read port node 1506. The first clipper circuitry 1508 may include a transistor 1512, which may be coupled to the first read port node 1504 at a drain terminal of the transistor 1512 and to the LBL node 408 at source terminal of the transistor 1512. The second clipper circuitry 1510 may include a transistor 1514, which may be coupled to the second read port node 1506 at a drain terminal of the transistor 1514 and to the LBL node 408 at a source terminal of the transistor 1514. The transistor 1512 and the transistor 1504 may include one or more of the features of the transistor 404 (FIG. 4), including the feature of providing a voltage drop equal to the threshold voltage of the transistor between the LBL node 408 and the corresponding read port node (the first read port node 1504 for the transistor 1512 and the second read port node 1506 for the transistor 1514). It is to be understood that in other embodiments with more than two read port nodes, there may be more than two clipper circuitries with one clipper circuitry coupled to each of the read ports.

A gate terminal of the transistor 1512 of the first clipper circuitry 1508 may be coupled to a first control node 1516, which may provide a first control signal to the gate terminal of the transistor 1512. The first control signal may control activation of the transistor 1512. The transistor 1512 may be activated when the first control signal is a logic high and may be deactivated when the first control signal is a logic low. The first control node 1516 may be floating.

A gate terminal of the transistor 1514 of the second clipper circuitry 1510 may be coupled to a second control node 1518, which may provide a second control signal to the gate terminal of the transistor 1514. The second control signal may control activation of the transistor 1514. The transistor 1514 may be activated when the second control signal is a logic high and may be deactivated when the second control signal is a logic low. The second control node 1518 may be floating.

The read port node corresponding to the activated transistor may be coupled to the LBL node 408, whereas the read port node corresponding to the deactivated transistor may be decoupled from the LBL node 408. For example, the first read port node 1504 may be coupled to the LBL node 408 and the second read port node 1506 may be decoupled from the LBL node 408 when the transistor 1512 is activated and the transistor 1514 is deactivated.

The first control signal and the second control signal may be configured such that one of the transistor 1512 and the transistor 1514 is activated at a time. For example, when the first control signal activates the transistor 1512, the second control signal may maintain the transistor 1514 in a deactivated state, and when the second control signal activates the transistor 1514, the first control signal may maintain the transistor 1512 in a deactivated state. In embodiments where there are more than two clipper circuitries, one of the clipper circuitries may be activated (via activating the transistor of the activated clipper circuitry) at a time.

The multiplexing read merge circuitry 1500 may further include a first NAND gate 1520. The first NAND gate 1520 may include one or more of the features of the first NAND gate 420 (FIG. 4), the first NAND gate 520 (FIG. 5), the first NAND gate 720 (FIG. 7), the first NAND gate 920 (FIG. 9), the first NAND gate 1020 (FIG. 10), the first NAND gate 1320 (FIG. 13), the first NAND gate 1420 (FIG. 14), or some combination thereof.

The first NAND gate 1520 may include three sets of transistors coupled in parallel, the three sets of transistors coupled between the supply rail 406 and an output node 1522 of the first NAND gate 1520. The first set may include a transistor 1524. The transistor 1524 may be coupled to the supply rail 406 at a drain terminal of the transistor 1524 and to the output node 1522 at the source terminal of the transistor 1524. A gate terminal of the transistor 1524 may be coupled to a precharge node 1526, the precharge node 1526 to provide a precharge signal to the gate terminal of the transistor 1524. The transistor 1524 may be activated when the precharge signal is a logic low and deactivated when the precharge signal is a logic high.

The second set of transistors coupled in parallel may include a first transistor 1528 and a second transistor 1530 coupled in series. A drain terminal of the first transistor 1528 may be coupled to the supply rail 406 and a source terminal of the first transistor 1528 may be coupled to the second transistor 1530. A drain terminal of the second transistor 1530 may be coupled to the first transistor 1528 and a source terminal of the second transistor 1530 may be coupled to the output node 1522 of the first NAND gate 1520. A gate terminal of the first transistor 1528 may be coupled to an inverse first control node 1532, the inverse first control node 1532 to provide a logical inverse of the first control signal to the gate terminal of the first transistor 1528. A gate terminal of the second transistor 1530 may be coupled to the first read port node 1504.

The third set of transistors coupled in parallel may include a first transistor 1534 and a second transistor 1536 coupled in series. A drain terminal of the first transistor 1534 may be coupled to the supply rail 406 and a source terminal of the first transistor 1534 may be coupled to the second transistor 1536. A drain terminal of the second transistor 1536 may be coupled to the first transistor 1534 and a source terminal of the second transistor 1536 may be coupled to the output node 1522 of the first NAND gate 1520. A gate terminal of the first transistor 1534 may be coupled to an inverse second control node 1538, the inverse second control node 1538 to provide a logical inverse of the second control signal to the gate terminal of the first transistor 1534. A gate terminal of the second transistor 1536 may be coupled to the second read port node 1506.

The inverse of the first control signal and the inverse of the second control signal may be configured to activate one of the first transistor 1528 of the second set of transistors and the first transistor 1534 of the third set of transistors at a time. The first transistor 1528 of the second set of transistors and the transistor 1512 of the first clipper circuitry 1508 may be activated at the same time. When the first transistor 1528 and the transistor 1512 are activated, the first NAND gate 1520 may output a result of a NAND operation, as applied to the value of the precharge node 1526 and a value of the first read port node 1504, on the output node 1522.

Further, the first transistor 1534 of the third set of transistors and the transistor 1514 of the second clipper circuitry 1510 may be activated at the same time. When the first transistor 1534 and the transistor 1514 are activated, the first NAND gate 1520 may output a result of a NAND operation, as applied to the value on the precharge node 1526 and the second read port node 1506, on the output node 1522.

In embodiments with more than two read port nodes, there may be more than three sets of transistors coupled in parallel within the first NAND gate 1520. In particular, there may be a set of transistors corresponding to each one of the read port nodes, the set of transistors resembling the second set of transistors and the third set of transistors. The first transistors of each of the set of transistors may be coupled to an inverse control node that provides an inverse of a control signal corresponding to the read port node.

Coupling the first read port node 1504 to the second transistor 1530 of the second set of transistors may cause the first NAND gate 1520 to transition the output node 1522 to a logic high sooner during discharge from a precharge phase (performed by precharge circuitry 410) when the second transistor 1530 is activated than if the second transistor 1530 was coupled to the LBL node 408. In particular, due to the first read port node 1504 being the voltage drop lower than the LBL node 408, a voltage at the gate terminal of the second transistor 1530 may reach a transition voltage (where the second transistor 1530 transitions between activated and deactivated states) sooner during discharge than if the LBL node 408 was coupled to the gate terminal. In response to the voltage at the gate terminal of the second transistor 1530 dropping below the transition voltage, the second transistor 1530 may transition to an activated state.

Further, coupling the second read port node 1506 to the second transistor 1536 of the third set of transistors may cause the first NAND gate 1520 to transition the output node 1522 to a logic high sooner during discharge from a precharge phase (performed by precharge circuitry 410) when the second transistor 1536 is activated than if the second transistor 1536 was coupled to the LBL node 408. In particular, due to the second read port node 1506 being the voltage drop lower than the LBL node 408, a voltage at the gate terminal of the second transistor 1536 may reach a transition voltage (where the second transistor 1536 transitions between activated and deactivated states) sooner during discharge than if the LBL node 408 was coupled to the gate terminal. In response to the voltage at the gate terminal of the second transistor 1536 dropping below the transition voltage, the second transistor 1536 may transition to an activated state.

In response to the second transistor 1530 or the second transistor 1536 transitioning to the activated state, the output node 1522 of the first NAND gate 1520 may transition to a logic high. The output node 1522 may be coupled to a portion of the transistors 418 of the keeper circuitry 416. One or more of the transistors 418 adjacent to the coupling to the supply rail 406 may have gate terminals coupled to ground 428, whereas the other transistors 418 may have gate terminals coupled to output node 1522 of the first NAND gate 1520. In the illustrated embodiment, the transistor 418a, the transistor 418b, and the transistor 418c adjacent to the coupling to the supply rail 406 may have gate terminals coupled to ground 428 and the transistor 418d and the transistor 418e may have gate terminals coupled to output node 1522.

Due to the output node 1522 transitioning to the logic high earlier than if the gate terminals of the second transistor 1530 and the second transistor 1536 were coupled to the LBL node 408, the transistor 418d and the transistor 418e may transition to a deactivated state earlier. The transistor 418d and the transistor 418e transitioning to the deactivated state may cause the transistor 418a, the transistor 418b, and the transistor 418c to transition to the deactivated state. During the activated state, the transistors 418 may experience voltage stress across the gate oxide of the transistors 418, which may degrade the transistors 418 (referred to as 'aging' of the transistors 418) and reduce the ability of the transistors 418 to withstand noise events. Due to the transistors 418 transitioning to the deactivated state earlier, the voltage stress the transistors 418 experience may be decreased and the degradation of the transistors 418 may be decreased.

The multiplexing read merge circuitry 1500 may further include a second NAND gate 1540. The second NAND gate 1540 may include one or more of the features of the second NAND gate 424 (FIG. 4), the second NAND gate 624 (FIG. 6), the second NAND gate 744 (FIG. 7), the second NAND gate 1124 (FIG. 11), the second NAND gate 1224 (FIG. 12), the second NAND gate 1344 (FIG. 13), the second NAND gate 1444 (FIG. 14), or some combination thereof.

In some embodiments, the LBL node 408 may be coupled to the second transistor 1530 and the second transistor 1536 rather than the first read port node 1504 and the second read port node 1506, respectively. Further, in these embodiments, the first NAND gate 1520 may be simplified to resemble the first NAND gate 420 (FIG. 4), with the LBL node 408 coupled to the first NAND gate 1520 and the NAND operation performed on a value of the LBL node 408 and the precharge node 1526.

Figure 16:
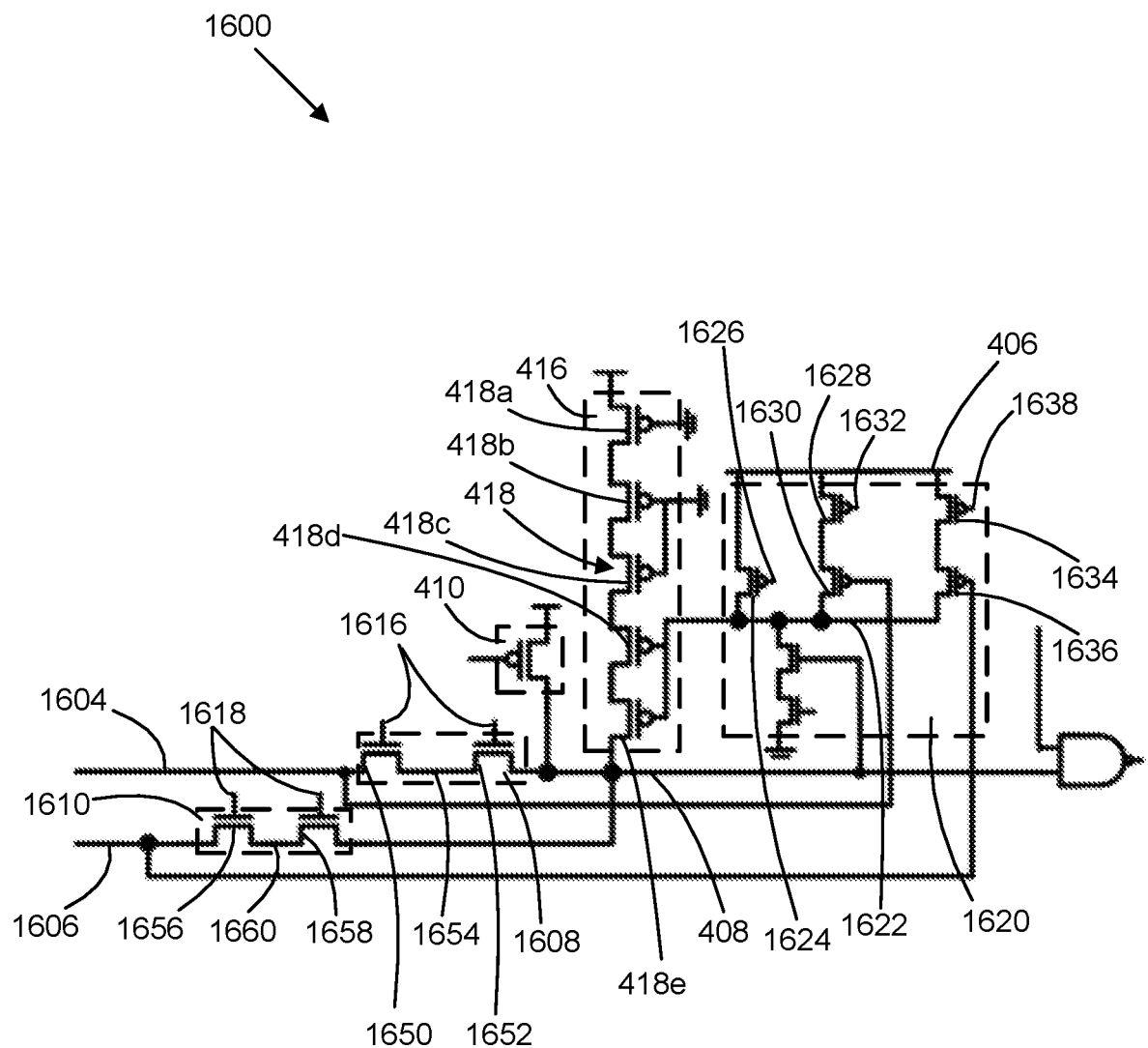
FIG. 16 illustrates a second example of multiplexing read merge circuitry, according to various embodiments.

FIG. 16 illustrates a second example of multiplexing read merge circuitry 1600, according to various embodiments. The multiplexing read merge circuitry 1600 may include one or more of the features of the read merge circuitry 118 (FIG. 1), the read merge circuitry 400 (FIG. 4), the read merge circuitry 500 (FIG. 5), the read merge circuitry 600 (FIG. 6), the read merge circuitry 700 (FIG. 7), the read merge circuitry 800 (FIG. 8), the read merge circuitry 900 (FIG. 9), the read merge circuitry 1000 (FIG. 10), the read merge circuitry 1100 (FIG. 11), the read merge circuitry 1200 (FIG. 12), the read merge circuitry 1300 (FIG. 13), the read merge circuitry 1400 (FIG. 14), the read merge circuitry 1500 (FIG. 15), or some combination thereof.

The multiplexing read merge circuitry 1600 may be coupled to multiple bitcell arrays (such as the bitcell array 200 (FIG. 2)) via multiple read port nodes. The illustrated embodiment includes a first read port node 1604 and a second read port node 1606. The first read port node 1604 may be coupled to a read port node (such as the read port node 204 (FIG. 2)) of a first bitcell array and the second read port node 1606 may be coupled to a read port node (such as the read port node 206 (FIG. 2)) of a second bitcell array. It is to be understood that in other embodiments, there may be more than two read port nodes, wherein each of the read port nodes may correspond to a separate bit cell array.

The multiplexing read merge circuitry 1600 may include first clipper circuitry 1608 and second clipper circuitry 1610. The clipper circuitry 1608 and the second clipper circuity 1610 may include one or more of the features of the clipper circuitry 110 (FIG. 1), the clipper circuitry 402 (FIG. 4), the clipper circuitry 502 (FIG. 5), the clipper circuitry 602 (FIG. 6), the clipper circuitry 702 (FIG. 7), the clipper circuitry 802 (FIG. 8), the clipper circuitry 902 (FIG. 9), the clipper circuitry 1002 (FIG. 10), the clipper circuitry 1102 (FIG. 11), the clipper circuitry 1202 (FIG. 12), the clipper circuitry 1302 (FIG. 13), the clipper circuitry (FIG. 14), the first clipper circuitry 1508 (FIG. 15), the second clipper circuitry 1510 (FIG. 15), or some combination thereof.

The first clipper circuitry 1608 may be coupled to the first read port node 1604 and the second clipper circuitry 1610 may be coupled to the second read port node 1506. The first clipper circuitry 1608 may include a first transistor 1650, which may be coupled to the first read port node 1604 at a drain terminal of the first transistor 1650 and to a first intermediate LBL node 1654 at source terminal of the first transistor 1650. The first intermediate LBL node 1652 may include one or more of the features of the intermediate LBL node 808 (FIG. 8). The first clipper circuitry 1608 may further include a second transistor 1652, which may be coupled to the first intermediate LBL node 1654 at a drain terminal of the second transistor 1652 and to the LBL node 408 at a source terminal of the second transistor 1652.

The second clipper circuitry 1610 may include a first transistor 1656, which may be coupled to the second read port node 1606 at a drain terminal of the transistor 1656 and a second intermediate LBL node 1660 at a source terminal of the first transistor 1656. The second intermediate LBL node 1660 may include one or more of the features of the intermediate LBL node 808 (FIG. 8). The second clipper circuitry 1610 may further include a second transistor 1658, which may be coupled to the second intermediate LBL node 1660 at a drain terminal of the second transistor 1658 and to the LBL node 408 at a source terminal of the second transistor 1658.

The first transistor 1650 and the first transistor 1656 may include one or more of the features of the first transistor 804 (FIG. 8), including the feature of providing a first voltage drop equal to the threshold voltage of the transistor between the corresponding intermediate LBL node (the first intermediate LBL node 1654 for the first transistor 1650 and the second intermediate LBL node 1660 for the first transistor 1656) and the corresponding read port node (the first read port node 1604 for the first transistor 1650 and the second read port node 1606 for the first transistor 1656). Further, the second transistor 1652 and the second transistor 1658 may include one or more of the features of the second transistor 806, include the feature of providing a second voltage drop equal to the threshold voltage of the transistor between the corresponding intermediate LBL node (the first intermediate LBL node 1654 for the second transistor 1652 and the second LBL node 1660 for the second transistor 1658) and the LBL node 408.

The first clipper circuitry 1608 may provide a first total voltage drop between the LBL node 408 and the first read port node 1604, the first total voltage drop equal to the sum of the first voltage drop of the first transistor 1650 and the second voltage drop of the second transistor 1652. The second clipper circuitry 1610 may provide a second total voltage drop between the LBL node 408 and the second read port node 1606, the second total voltage drop equal to sum of the first voltage drop of the first transistor 1656 and the second voltage drop of the second transistor 1658. It is to be understood that in other embodiments with more than two read port nodes, there may be more than two clipper circuitries with one clipper circuitry coupled to each of the read ports.

Gate terminals of the first transistor 1650 and the second transistor 1652 of the first clipper circuitry 1608 may be coupled to a first control node 1616, which may provide a first control signal to the gate terminals of the first transistor 1650 and the second transistor 1652. The first control signal may control activation of the first transistor 1650 and the second transistor 1652. The first transistor 1650 and the second transistor 1652 may be activated when the first control signal is a logic high and may be deactivated when the first control signal is a logic low. The first control node 1616 may be floating.

Gate terminals of the first transistor 1656 and the second transistor 1658 of the second clipper circuitry 1610 may be coupled to a second control node 1618, which may provide a second control signal to the gate terminals of the first transistor 1656 and the second transistor 1658. The second control signal may control activation of the first transistor 1656 and the second transistor 1658. The first transistor 1656 and the second transistor 1658 may be activated when the second control signal is a logic high and may be deactivated when the second control signal is a logic low. The second control node 1618 may be floating.

The read port node corresponding to the activated transistors may be coupled to the LBL node 408, whereas the read port node corresponding to the deactivated transistors may be decoupled from the LBL node 408. For example, the first read port node 1604 may be coupled to the LBL node 408 and the second read port node 1606 may be decoupled from the LBL node 408 when the first transistor 1650 and the second transistor 1652 are activated and the first transistor 1656 and the second transistor 1658 are deactivated.

The first control signal and the second control signal may be configured such that either the first transistor 1650 and the second transistor 1652 or the first transistor 1656 and the second transistor 1658 is activated at a time. For example, when the first control signal activates the first transistor 1650 and the second transistor 1652, the second control signal may maintain the first transistor 1656 and the second transistor 1658 in a deactivated state, and when the second control signal activates the first transistor 1656 and the second transistor 1658, the first control signal may maintain the first transistor 1650 and the second transistor 1652 in a deactivated state. In embodiments where there are more than two clipper circuitries, one of the clipper circuitries may be activated (via activating the transistor of the activated clipper circuitry) at a time.

The multiplexing read merge circuitry 1600 may further include a first NAND gate 1620. The first NAND gate 1620 may include one or more of the features of the first NAND gate 420 (FIG. 4), the first NAND gate 520 (FIG. 5), the first NAND gate 720 (FIG. 7), the first NAND gate 920 (FIG. 9), the first NAND gate 1020 (FIG. 10), the first NAND gate 1320 (FIG. 13), the first NAND gate 1420 (FIG. 14), the first NAND gate 1520 (FIG. 15), or some combination thereof.

The first NAND gate 1620 may include three sets of transistors coupled in parallel, the three sets of transistors coupled between the supply rail 406 and an output node 1622 of the first NAND gate 1620. The first set may include a transistor 1624. The transistor 1624 may be coupled to the supply rail 406 at a drain terminal of the transistor 1624 and to the output node 1622 at the source terminal of the transistor 1624. A gate terminal of the transistor 1624 may be coupled to a precharge node 1626, the precharge node 1626 to provide a precharge signal to the gate terminal of the transistor 1624. The transistor 1624 may be activated when the precharge signal is a logic low and deactivated when the precharge signal is a logic high.

The second set of transistors coupled in parallel may include a first transistor 1628 and a second transistor 1630 coupled in series. A drain terminal of the first transistor 1628 may be coupled to the supply rail 406 and a source terminal of the first transistor 1628 may be coupled to the second transistor 1630. A drain terminal of the second transistor 1630 may be coupled to the first transistor 1628 and a source terminal of the second transistor 1630 may be coupled to the output node 1622 of the first NAND gate 1620. A gate terminal of the first transistor 1628 may be coupled to an inverse first control node 1632, the inverse first control node 1632 to provide a logical inverse of the first control signal to the gate terminal of the first transistor 1628. A gate terminal of the second transistor 1630 may be coupled to the first read port node 1604.

The third set of transistors coupled in parallel may include a first transistor 1634 and a second transistor 1636 coupled in series. A drain terminal of the first transistor 1634 may be coupled to the supply rail 406 and a source terminal of the first transistor 1634 may be coupled to the second transistor 1636. A drain terminal of the second transistor 1636 may be coupled to the first transistor 1634 and a source terminal of the second transistor 1636 may be coupled to the output node 1622 of the first NAND gate 1620. A gate terminal of the first transistor 1634 may be coupled to an inverse second control node 1638, the inverse second control node 1638 to provide a logical inverse of the second control signal to the gate terminal of the first transistor 1634. A gate terminal of the second transistor 1636 may be coupled to the second read port node 1606.

The inverse of the first control signal and the inverse of the second control signal may be configured to activate one of the first transistor 1628 of the second set of transistors and the first transistor 1634 of the third set of transistors at a time. The first transistor 1628 of the second set of transistors and the first transistor 1650 and the second transistor 1652 of the first clipper circuitry 1608 may be activated at the same time. When the first transistor 1628 of the second set of transistors and the first transistor 1650 and the second transistor 1652 of the first clipper circuitry 1608 are activated, the first NAND gate 1620 may output a result of a NAND operation, as applied to the value of the precharge node 1626 and a value of the first read port node 1604, on the output node 1622.

Further, the first transistor 1634 of the third set of transistors and the first transistor 1656 and the second transistor 1658 of the second clipper circuitry 1610 may be activated at the same time. When the first transistor 1634 of the third set of transistors and the first transistor 1656 and the second transistor 1658 of the second clipper circuitry 1610 are activated, the first NAND gate 1620 may output a result of a NAND operation, as applied to the value on the precharge node 1626 and the second read port node 1606, on the output node 1622.

In embodiments with more than two read port nodes, there may be more than three sets of transistors coupled in parallel within the first NAND gate 1620. In particular, there may be a set of transistors corresponding to each one of the read port nodes, the set of transistors resembling the second set of transistors and the third set of transistors. The first transistors of each of the set of transistors may be coupled to an inverse control node that provides an inverse of a control signal corresponding to the read port node.

Coupling the first read port node 1604 to the second transistor 1630 of the second set of transistors may cause the first NAND gate 1620 to transition the output node 1622 to a logic high sooner during discharge from a precharge phase (performed by precharge circuitry 410) when the second transistor 1630 is activated than if the second transistor 1630 was coupled to the LBL node 408. In particular, due to the first read port node 1604 being the first total voltage drop lower than the LBL node 408, a voltage at the gate terminal of the second transistor 1630 may reach a transition voltage (where the second transistor 1530 transitions between activated and deactivated states) sooner during discharge than if the LBL node 408 was coupled to the gate terminal. In response to the voltage at the gate terminal of the second transistor 1630 dropping below the transition voltage, the second transistor 1630 may transition to an activated state.

Further, coupling the second read port node 1606 to the second transistor 1636 of the third set of transistors may cause the first NAND gate 1620 to transition the output node 1622 to a logic high sooner during discharge from a precharge phase (performed by precharge circuitry 410) when the second transistor 1636 is activated than if the second transistor 1636 was coupled to the LBL node 408. In particular, due to the second read port node 1606 being the second total voltage drop lower than the LBL node 408, a voltage at the gate terminal of the second transistor 1636 may reach a transition voltage (where the second transistor 1630 transitions between activated and deactivated states) sooner during discharge than if the LBL node 408 was coupled to the gate terminal. In response to the voltage at the gate terminal of the second transistor 1636 dropping below the transition voltage, the second transistor 1636 may transition to an activated state.

In response to the second transistor 1630 or the second transistor 1636 transitioning to the activated state, the output node 1622 of the first NAND gate 1620 may transition to a logic high. The output node 1622 may be coupled to a portion of the transistors 418 of the keeper circuitry 416. One or more of the transistors 418 adjacent to the coupling to the supply rail 406 may have gate terminals coupled to ground 428, whereas the other transistors 418 may have gate terminals coupled to output node 1622 of the first NAND gate 1620. In the illustrated embodiment, the transistor 418a, the transistor 418b, and the transistor 418c adjacent to the coupling to the supply rail 406 may have gate terminals coupled to ground 428 and the transistor 418d and the transistor 418e may have gate terminals coupled to output node 1622.

Due to the output node 1622 transitioning to the logic high earlier than if the gate terminals of the second transistor 1630 and the second transistor 1636 were coupled to the LBL node 408, the transistor 418d and the transistor 418e may transition to a deactivated state earlier. The transistor 418d and the transistor 418e transitioning to the deactivated state may cause the transistor 418a, the transistor 418b, and the transistor 418c to transition to the deactivated state. During the activated state, the transistors 418 may experience voltage stress across the gate oxide of the transistors 418, which may degrade the transistors 418 (referred to as 'aging' of the transistors 418) and reduce the ability of the transistors 418 to withstand noise events. Due to the transistors 418 transitioning to the deactivated state earlier, the voltage stress the transistors 418 experience may be decreased and the degradation of the transistors 418 may be decreased.

The multiplexing read merge circuitry 1600 may further include a second NAND gate 1640. The second NAND gate 1640 may include one or more of the features of the second NAND gate 424 (FIG. 4), the second NAND gate 624 (FIG. 6), the second NAND gate 744 (FIG. 7), the second NAND gate 1124 (FIG. 11), the second NAND gate 1224 (FIG. 12), the second NAND gate 1344 (FIG. 13), the second NAND gate 1444 (FIG. 14), the second NAND gate 1540 (FIG. 15), or some combination thereof.

In some embodiments, the first intermediate LBL node 1654 may be coupled to the second transistor 1630 rather than the first read port node 1604 and the second intermediate LBL node 1660 may be coupled to the second transistor 1636 rather than the second read port node 1606. In these embodiments, the multiplexing read merge circuitry 1700 may operate the same as described above, with the exception of the transition of the output 1622 being based on the second voltage drop associated with the second transistor 1652 and the second voltage drop associated with the second transistor 1658 rather than being based on the first total voltage drop and the second total voltage drop.

Further, in some embodiments, the LBL node 408 may be coupled to the second transistor 1630 and the second transistor 1636 rather than the first read port node 1604 and the second read port node 1606, respectively. Further, in these embodiments, the first NAND gate 1620 may be simplified to resemble the first NAND gate 420 (FIG. 4), with the LBL node 408 coupled to the first NAND gate 1620 and the NAND operation performed on a value of the LBL node 408 and the precharge node 1626.

Figure 17:
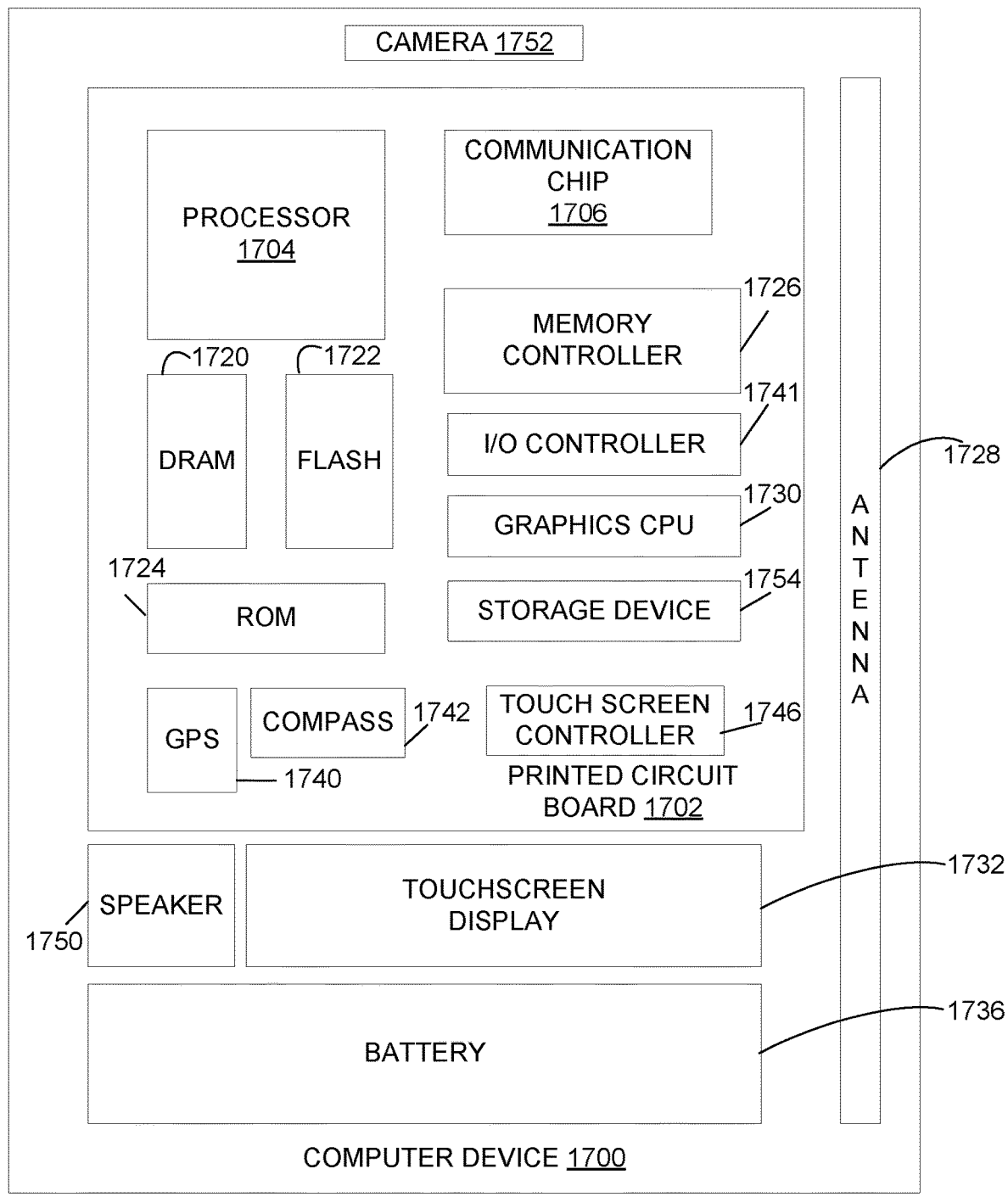
FIG. 17 illustrates an example computing device that may employ the apparatuses and/or methods described herein.

FIG. 17 illustrates an example computer device 1700 that may employ the apparatuses and/or methods described herein (e.g., the single-ended sensing array 100, the bitcell array 200, the SDL 300, the read merge circuitry 400, the read merge circuitry 500, the read merge circuitry 600, the read merge circuitry 700, the read merge circuitry 800, the read merge circuitry 900, the read merge circuitry 1000, the read merge circuitry 1100, the read merge circuitry 1200, the read merge circuitry 1300, the read merge circuitry 1400, the multiplexing read merge circuitry 1500, and/or the multiplexing read merge circuitry 1600), in accordance with various embodiments. As shown, computer device 1700 may include a number of components, such as one or more processor(s) 1704 (one shown) and at least one communication chip 1706. In various embodiments, the one or more processor(s) 1704 each may include one or more processor cores. In various embodiments, the at least one communication chip 1706 may be physically and electrically coupled to the one or more processor(s) 1704. In further implementations, the communication chip 1706 may be part of the one or more processor(s) 1704. In various embodiments, computer device 1700 may include printed circuit board (PCB) 1702. For these embodiments, the one or more processor(s) 1704 and communication chip 1706 may be disposed thereon. In alternate embodiments, the various components may be coupled without the employment of PCB 1702.

Depending on its applications, computer device 1700 may include other components that may or may not be physically and electrically coupled to the PCB 1702. These other components include, but are not limited to, memory controller 1726, volatile memory (e.g., dynamic random access memory (DRAM) 1720), non-volatile memory such as read only memory (ROM) 1724, flash memory 1722, storage device 1754 (e.g., a hard-disk drive (HDD)), an I/O controller 1741, a digital signal processor (not shown), a crypto processor (not shown), a graphics processor 1730, one or more antenna 1728, a display (not shown), a touch screen display 1732, a touch screen controller 1746, a battery 1736, an audio codec (not shown), a video codec (not shown), a global positioning system (GPS) device 1740, a compass 1742, an accelerometer (not shown), a gyroscope (not shown), a speaker 1750, a camera 1752, and a mass storage device (such as hard disk drive, a solid state drive, compact disk (CD), digital versatile disk (DVD)) (not shown), and so forth.

The processor(s) 1704, the volatile memory, the non-volatile memory, or some combination thereof may include and/or implement one or more of the single-ended sensing array 100, the bitcell array 200, the SDL 300, the read merge circuitry 400, the read merge circuitry 500, the read merge circuitry 600, the read merge circuitry 700, the read merge circuitry 800, the read merge circuitry 900, the read merge circuitry 1000, the read merge circuitry 1100, the read merge circuitry 1200, the read merge circuitry 1300, the read merge circuitry 1400, the multiplexing read merge circuitry 1500, and/or the multiplexing read merge circuitry 1600 described herein.

In some embodiments, the one or more processor(s) 1704, flash memory 1722, and/or storage device 1754 may include associated firmware (not shown) storing programming instructions configured to enable computer device 1700, in response to execution of the programming instructions by one or more processor(s) 1704, to practice all or selected aspects of the methods described herein. In various embodiments, these aspects may additionally or alternatively be implemented using hardware separate from the one or more processor(s) 1704, flash memory 1722, or storage device 1754.

The communication chips 1706 may enable wired and/or wireless communications for the transfer of data to and from the computer device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1706 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 1700 may include a plurality of communication chips 1706. For instance, a first communication chip 1706 may be dedicated to shorter range wireless communications such as Wi-Fi and Bluetooth, and a second communication chip 1706 may be dedicated to longer range wireless communications such as GPS, EDGE, GPRS, CDMA, WiMAX, LTE, Ev-DO, and others.

In various implementations, the computer device 1700 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 1700 may be any other electronic device that processes data.

Example 1 may include a memory device, comprising bitcell arrays, clipper circuitry coupled to a read port node of a first bitcell array of the bitcell arrays and a local bitline (LBL) node, the clipper circuitry to provide a voltage drop between the read port node and the LBL node, read merge circuitry coupled to the clipper circuitry at the LBL node, the read merge circuitry to drive a value of a global bitline (GBL) node based on a value of the LBL node, and a set dominant latch coupled to the GBL node to sense the value of the GBL node.

Example 2 may include the memory device of example 1, wherein the clipper circuitry includes a transistor to provide the voltage drop between the read port node and the LBL node.

Example 3 may include the memory device of any of the examples 1 and 2, wherein the read merge circuitry includes a NAND gate, wherein a first transistor of the NAND gate is coupled to the read port node and a second transistor of the NAND gate is coupled to the LBL node.

Example 4 may include the memory device of example 3, wherein the read port node is coupled to a gate of the first transistor and the LBL is coupled to a gate of the second transistor.

Example 5 may include the memory device of example 3, wherein an output of the NAND gate is coupled to at least one transistor of a keeper stack.

Example 6 may include the memory device of example 3, wherein an output of the NAND gate is coupled to a drive transistor, the drive transistor to drive the value of the GBL node.

Example 7 may include the memory device of any of the examples 1 and 2, wherein the read merge circuitry includes a first NAND gate and a second NAND gate, the first NAND gate coupled to at least one transistor of a keeper stack and the second NAND gate coupled to a drive transistor to drive the value of the GBL node, wherein the read port node is coupled to a first transistor within the first NAND gate and the LBL node is coupled to a second transistor within the first NAND gate.

Example 8 may include the memory device of any of the examples 1 and 2, wherein the read merge circuitry includes a first NAND gate and a second NAND gate, the first NAND gate coupled to at least one transistor of a keeper stack and the second NAND gate coupled to a drive transistor to drive the value of the GBL node, wherein the read port node is coupled to a first transistor within the second NAND gate and the LBL node is coupled to a second transistor within the second NAND gate.

Example 9 may include the memory device of any of the examples 1 and 2, wherein the voltage drop is a total voltage drop, wherein the clipper circuitry includes a first transistor and a second transistor coupled in series, the first transistor of the clipper circuitry coupled to the read port node and to provide a first voltage drop, the second transistor of the clipper circuitry coupled to the LBL node and to provide a second voltage drop, and wherein the total voltage drop is equal to a sum of the first voltage drop and the second voltage drop.

Example 10 may include the memory device of example 9, wherein the read merge circuitry includes a NAND gate, wherein a first transistor of the NAND gate is coupled to an intermediate LBL node located between the first transistor of the clipper circuitry and the second transistor of the clipper circuitry, and wherein a second transistor of the NAND gate is coupled to the LBL node.

Example 11 may include the memory device of example 10, wherein the read port node is coupled to a gate of the first transistor of the NAND gate and the LBL node is coupled to a gate of the second transistor of the NAND gate.

Example 12 may include the memory device of example 10, wherein an output of the NAND gate is coupled to at least one transistor of a keeper stack.

Example 13 may include the memory device of example 10, wherein an output of the NAND gate is coupled to a drive transistor, the drive transistor to drive the value of the GBL node.

Example 14 may include the memory device of any of the examples 1 and 2, wherein the clipper circuitry is first clipper circuitry, wherein the voltage drop is a first voltage drop, and wherein the memory device further comprises second clipper circuitry coupled to a read port node of a second bitcell array of the bitcell arrays and the LBL node, the second clipper circuitry to provide a second voltage drop between the read port node of the second bitcell array and the LBL node.

Example 15 may include the memory device of example 14, wherein the read merge circuitry is further coupled to the second clipper circuitry at the LBL node.

Example 16 may include the memory device of example 15, wherein the first clipper circuitry and the second clipper circuitry are to alternately couple the read port node of the first bitcell array and the read port node of the second bitcell array to the LBL node based on at least one control signal.

Example 17 may include the memory device of any of the examples 1 and 2, wherein the first bitcell array includes one or more bitcells coupled to the read port node.

Example 18 may include read merge circuitry, comprising clipper circuitry coupled to a local bitline (LBL) node and to be coupled to a read port node of a bitcell array, the clipper circuitry to provide a voltage drop between the read port node and the LBL node, precharge circuitry coupled to the LBL node and a power supply that provides an input voltage, the precharge circuitry to precharge the LBL node to the input voltage based on a precharge signal, keeper circuitry coupled to the LBL node and the power supply, the keeper circuitry to maintain a value of the LBL node, a first NAND gate coupled to the keeper circuitry and the LBL node, the first NAND gate to control the keeper circuitry based on a value of the LBL node, and a second NAND gate coupled to the LBL node and to be coupled to a global bitline (GBL) node for a set dominant latch, the second NAND gate to drive a value of the GBL node based, at least partially, on the value of the LBL node.

Example 19 may include the read merge circuitry of example 18, wherein the LBL node is coupled to a first transistor of the first NAND gate, and wherein the read port node is coupled to a second transistor of the first NAND gate.

Example 20 may include the read merge circuitry of example 19, wherein the LBL node is coupled to a first transistor of the second NAND gate, and wherein the read port node is coupled to a second transistor of the second NAND gate.

Example 21 may include the read merge circuitry of example 19, wherein the first transistor of the first NAND gate is one of two paired transistors within the first NAND gate.

Example 22 may include the read merge circuitry of example 21, wherein a second of the two paired transistors is controlled by the precharge signal.

Example 23 may include the read merge circuitry of any of the examples 18-22, wherein the LBL node is coupled to a first transistor of the second NAND gate, and wherein the read port node is coupled to a second transistor of the second NAND gate.

Example 24 may include the read merge circuitry of example 23, wherein the first transistor of the second NAND gate is one of two paired transistors within the second NAND gate.

Example 25 may include the read merge circuitry of any of the examples 18-22, wherein the clipper circuitry includes a transistor to provide the voltage drop between the read port node and the LBL node.

Example 26 may include the read merge circuitry of any of the examples 18-22, wherein the keeper circuitry includes two or more transistors coupled in series, and wherein an output of the first NAND gate is coupled to at least one transistor of the two or more transistors and controls the at least one transistor.

Example 27 may include the read merge circuitry of any of the examples 18-22, wherein the voltage drop is a total voltage drop, wherein the clipper circuitry includes a first transistor and a second transistor coupled in series, the first transistor of the clipper circuitry coupled to the read port node and to provide a first voltage drop, the second transistor of the clipper circuitry coupled to the LBL node and to provide a second voltage drop, and wherein the total voltage drop is equal to a sum of the first voltage drop and the second voltage drop.

Example 28 may include the read merge circuitry of example 27, wherein the first NAND gate includes a first transistor and a second transistor, wherein a gate of the first transistor of the first NAND gate is coupled to an intermediate LBL node located between the first transistor of the clipper circuitry and the second transistor of the clipper circuitry, and wherein a gate of the second transistor of the first NAND gate is coupled to the LBL node.

Example 29 may include the read merge circuitry of example 27, wherein the second NAND gate includes a first transistor and a second transistor, wherein a gate of the first transistor of the second NAND gate is coupled to an intermediate LBL node located between the first transistor of the clipper circuitry and the second transistor of the clipper circuitry, and wherein a gate of the second transistor of the second NAND gate is coupled to the LBL node.

Example 30 may include the read merge circuitry of any of the examples 18-22, wherein the clipper circuitry is first clipper circuitry, wherein the bitcell array is a first bitcell array, wherein the voltage drop is a first voltage drop, and wherein the read merge circuitry further comprises second clipper circuitry coupled to the LBL node and to be coupled to a read port node of a second bitcell array, the second clipper circuitry to provide a second voltage drop between the LBL node and the read port node of the second bitcell array.

Example 31 may include the read merge circuitry of example 30, wherein the first clipper circuitry and the second clipper circuitry are to alternately couple the read port node of the first bitcell array and the read port node of the second bitcell array to the LBL node based on at least one control signal.

Example 32 may include a system comprising a printed circuit board (PCB), a memory device mounted to the PCB, the memory device comprising bitcell arrays, clipper circuitry coupled to a read port node of a first bitcell array of the bitcell arrays and a local bitline (LBL) node, the clipper circuitry to provide a voltage drop between the read port node and the LBL node, read merge circuitry coupled to the clipper circuitry, the read merge circuitry to drive a value of a global bitline (GBL) node based on a value of the LBL node, and a set dominant latch coupled to the GBL node to sense the value of the GBL node.

Example 33 may include the system of example 32, wherein the clipper circuitry includes a transistor to provide the voltage drop between the read port node and the LBL node.

Example 34 may include the system of any of the examples 32 and 33, wherein the read merge circuitry includes a NAND gate, wherein a first transistor of the NAND gate is coupled to the read port node and a second transistor of the NAND gate is coupled to the LBL node.

Example 35 may include the system of example 34, wherein the read port node is coupled to a gate of the first transistor and the LBL is coupled to a gate of the second transistor.

Example 36 may include the system of example 34, wherein an output of the NAND gate is coupled to at least one transistor of a keeper stack.

Example 37 may include the system of example 34, wherein an output of the NAND gate is coupled to a drive transistor, the drive transistor to drive the value of the GBL node.

Example 38 may include the system of any of the examples 32 and 33, wherein the read merge circuitry includes a first NAND gate and a second NAND gate, the first NAND gate coupled to at least one transistor of a keeper stack and the second NAND gate coupled to a drive transistor to drive the value of the GBL node, wherein the read port node is coupled to a first transistor within the first NAND gate and the LBL node is coupled to a second transistor within the first NAND gate.

Example 39 may include the system of any of the examples 32 and 33, wherein the read merge circuitry includes a first NAND gate and a second NAND gate, the first NAND gate coupled to at least one transistor of a keeper stack and the second NAND gate coupled to a drive transistor to drive the value of the GBL node, wherein the read port node is coupled to a first transistor within the second NAND gate and the LBL node is coupled to a second transistor within the second NAND gate.

Example 40 may include the system of any of the examples 32 and 33, wherein the voltage drop is a total voltage drop, wherein the clipper circuitry includes a first transistor and a second transistor coupled in series, the first transistor of the clipper circuitry coupled to the read port node and to provide a first voltage drop, the second transistor of the clipper circuitry coupled to the LBL node and to provide a second voltage drop, and wherein the total voltage drop is equal to a sum of the first voltage drop and the second voltage drop.

Example 41 may include the system of example 40, wherein the read merge circuitry includes a NAND gate, wherein a first transistor of the NAND gate is coupled to an intermediate LBL node located between the first transistor of the clipper circuitry and the second transistor of the clipper circuitry, and wherein a second transistor of the NAND gate is coupled to the LBL node.

Example 42 may include the system of example 41, wherein the read port node is coupled to a gate of the first transistor of the NAND gate and the LBL node is coupled to a gate of the second transistor of the NAND gate.

Example 43 may include the system of example 41, wherein an output of the NAND gate is coupled to at least one transistor of a keeper stack.

Example 44 may include the system of example 41, wherein an output of the NAND gate is coupled to a drive transistor, the drive transistor to drive the value of the GBL node.

Example 45 may include the system of any of the examples 32 and 33, wherein the clipper circuitry is first clipper circuitry, wherein the voltage drop is a first voltage drop, and wherein the memory device further comprises second clipper circuitry coupled to a read port node of a second bitcell array of the bitcell arrays and the LBL node, the second clipper circuitry to provide a second voltage drop between the read port node of the second bitcell array and the LBL node.

Example 46 may include the system of example 45, wherein the read merge circuitry is further coupled to the second clipper circuitry at the LBL node.

Example 47 may include the system of example 46, wherein the first clipper circuitry and the second clipper circuitry are to alternately couple the read port node of the first bitcell array and the read port node of the second bitcell array to the LBL node based on at least one control signal.

Example 48 may include the system of any of the examples 32 and 33, wherein the first bitcell array includes one or more bitcells coupled to the read port node.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. Read merge circuitry, comprising:
   clipper circuitry coupled to a local bitline (LBL) node and to be coupled to a read port node of a bitcell array, the clipper circuitry to provide a voltage drop between the read port node and the LBL node;
   precharge circuitry coupled to the LBL node and a power supply that provides an input voltage, the precharge circuitry to precharge the LBL node to the input voltage based on a precharge signal;
   keeper circuitry coupled to the LBL node and the power supply, the keeper circuitry to maintain a value of the LBL node;
   a first NAND gate coupled to the keeper circuitry and the LBL node, the first NAND gate to control the keeper circuitry based on a value of the LBL node; and
   a second NAND gate coupled to the LBL node and to be coupled to a global bitline (GBL) node for a set dominant latch, the second NAND gate to drive a value of the GBL node based, at least partially, on the value of the LBL node.

2. The read merge circuitry of claim 1, wherein the LBL node is coupled to a first transistor of the first NAND gate, and wherein the read port node is coupled to a second transistor of the first NAND gate.

3. The read merge circuitry of claim 1, wherein the LBL node is coupled to a first transistor of the second NAND gate, and wherein the read port node is coupled to a second transistor of the second NAND gate.

4. The read merge circuitry of claim 1, wherein the voltage drop is a total voltage drop, wherein the clipper circuitry includes a first transistor and a second transistor coupled in series, the first transistor of the clipper circuitry coupled to the read port node and to provide a first voltage drop, the second transistor of the clipper circuitry coupled to the LBL node and to provide a second voltage drop, and wherein the total voltage drop is equal to a sum of the first voltage drop and the second voltage drop.

5. The read merge circuitry of claim 4, wherein the first NAND gate includes a first transistor and a second transistor, wherein a gate terminal of the first transistor of the first NAND gate is coupled to an intermediate LBL node located between the first transistor of the clipper circuitry and the second transistor of the clipper circuitry, and wherein a gate terminal of the second transistor of the first NAND gate is coupled to the LBL node.

6. The read merge circuitry of claim 4, wherein the second NAND gate includes a first transistor and a second transistor, wherein a gate terminal of the first transistor of the second NAND gate is coupled to an intermediate LBL node located between the first transistor of the clipper circuitry and the second transistor of the clipper circuitry, and wherein a gate terminal of the second transistor of the second NAND gate is coupled to the LBL node.

7. The read merge circuitry of claim 1, wherein the clipper circuitry is first clipper circuitry, wherein the bitcell array is a first bitcell array, wherein the voltage drop is a first voltage drop, and wherein the read merge circuitry further comprises second clipper circuitry coupled to the LBL node and to be coupled to a read port node of a second bitcell array, the second clipper circuitry to provide a second voltage drop between the LBL node and the read port node of the second bitcell array.

8. The read merge circuitry of claim 7, wherein the first clipper circuitry and the second clipper circuitry are to alternately couple the read port node of the first bitcell array and the read port node of the second bitcell array to the LBL node based on at least one control signal.

9. The read merge circuitry of claim 1, wherein the clipper circuitry includes a transistor to provide the voltage drop between the read port node and the LBL node.

10. The read merge circuitry of claim 1, wherein the keeper circuitry includes two or more transistors coupled in series, and wherein an output of the first NAND gate is coupled to at least one transistor of the two or more transistors and controls the at least one transistor.

11. A computing system comprising:
   a printed circuit board (PCB);
   a memory device mounted to the PCB, the memory device including:
      a bitcell array;
      a set dominant latch coupled to a global bitline (GBL) node; and
      read merge circuitry coupled to the bitcell array and the set dominant latch, the read merge circuitry including:
         clipper circuitry coupled to a local bitline (LBL) node and coupled to a read port node of the bitcell array, the clipper circuitry to provide a voltage drop between the read port node and the LBL node;

precharge circuitry coupled to the LBL node and a power supply that provides an input voltage, the precharge circuitry to precharge the LBL node to the input voltage based on a precharge signal;

keeper circuitry coupled to the LBL node and the power supply, the keeper circuitry to maintain a value of the LBL node;

a first NAND gate coupled to the keeper circuitry and the LBL node, the first NAND gate to control the keeper circuitry based on a value of the LBL node; and a second NAND gate coupled to the LBL node and coupled to the GBL node for the set dominant latch, the second NAND gate to drive a value of the GBL node based on the value of the LBL node.

12. The computing system of claim 11, wherein the LBL node is coupled to a first transistor of the first NAND gate, and wherein the read port node is coupled to a second transistor of the first NAND gate.

13. The computing system of claim 12, wherein the LBL node is coupled to a first transistor of the second NAND gate, and wherein the read port node is coupled to a second transistor of the second NAND gate.

14. The computing system of claim 11, wherein the voltage drop is a total voltage drop, wherein the clipper circuitry includes a first transistor and a second transistor coupled in series, the first transistor of the clipper circuitry coupled to the read port node and to provide a first voltage drop, the second transistor of the clipper circuitry coupled to the LBL node and to provide a second voltage drop, and wherein the total voltage drop is equal to a sum of the first voltage drop and the second voltage drop.

15. The computing system of claim 14, wherein the first NAND gate includes a first transistor and a second transistor, wherein a gate terminal of the first transistor of the first NAND gate is coupled to an intermediate LBL node located between the first transistor of the clipper circuitry and the second transistor of the clipper circuitry, and wherein a gate terminal of the second transistor of the first NAND gate is coupled to the LBL node.

16. The computing system of claim 14, wherein the second NAND gate includes a first transistor and a second transistor, wherein a gate terminal of the first transistor of the second NAND gate is coupled to an intermediate LBL node located between the first transistor of the clipper circuitry and the second transistor of the clipper circuitry, and wherein a gate terminal of the second transistor of the second NAND gate is coupled to the LBL node.

17. The computing system of claim 11, wherein the clipper circuitry is first clipper circuitry, wherein the bitcell array is a first bitcell array, wherein the voltage drop is a first voltage drop, wherein the memory device further includes a second bitcell array, and wherein the read merge circuitry further includes second clipper circuitry coupled to the LBL node and coupled to a read port node of the second bitcell array, the second clipper circuitry to provide a second voltage drop between the LBL node and the read port node of the second bitcell array.

18. The computing system of claim 17, wherein the first clipper circuitry and the second clipper circuitry are to alternately couple the read port node of the first bitcell array and the read port node of the second bitcell array to the LBL node based on at least one control signal.

19. The computing system of claim 11, further comprising one or more of a processor, a communication chip, an antenna, or a display coupled to the memory device.

20. A memory device, comprising:
bitcell arrays;
means for providing a voltage drop between a read port node, of a first bitcell array of the bitcell arrays, and a local bitline (LBL) node;
means for driving a value of a global bitline (GBL) node based on a value of the LBL node; and
means to sense the value of the GBL node.

21. The memory device of claim 20, wherein the means for driving the value of the GBL node includes a NAND gate with a first transistor and a second transistor, wherein a gate terminal of the first transistor is coupled to the read port node and a gate terminal of the second transistor is coupled to the LBL node.

22. The memory device of claim 20, wherein the voltage drop is a total voltage drop, wherein the means to provide the voltage drop includes a first voltage drop means and a second voltage drop means coupled in series, the first voltage drop means coupled to the read port node and to provide a first voltage drop, the second voltage drop means coupled to the LBL node and to provide a second voltage drop, and wherein the total voltage drop is equal to a sum of the first voltage drop and the second voltage drop.

23. The memory device of claim 22, wherein the means for driving the value of the GBL node includes a NAND gate with a first transistor and a second transistor, wherein a gate terminal of the first transistor is coupled to an intermediate LBL node located between the first and second voltage drop means, and wherein a gate terminal of the second transistor is coupled to the LBL node.

* * * * *